(12) United States Patent
Singer et al.

(10) Patent No.: US 7,126,137 B2
(45) Date of Patent: Oct. 24, 2006

(54) ILLUMINATION SYSTEM WITH FIELD MIRRORS FOR PRODUCING UNIFORM SCANNING ENERGY

(75) Inventors: Wolfgang Singer, Aalen (DE); Joachim Hainz, Aalen (DE); Hans-Joachim Frasch, Aalen (DE); Johannes Wangler, Königsbronn (DE); Joachim Wietzorrek, Aalen (DE); Jörg Schultz, Aalen (DE)

(73) Assignee: Carl Zeiss SMT AG, Oberkochen (DE)

( * ) Notice: Subject to any disclaimer, the term of this patent is extended or adjusted under 35 U.S.C. 154(b) by 110 days.

(21) Appl. No.: 10/827,916

(22) Filed: Apr. 20, 2004

(65) Prior Publication Data

US 2004/0232354 A1    Nov. 25, 2004

Related U.S. Application Data

(63) Continuation-in-part of application No. 09/514,040, filed on Feb. 25, 2000, now Pat. No. 6,770,894, and a continuation-in-part of application No. 10/201,652, filed on Jul. 22, 2002, now Pat. No. 6,859,328, which is a continuation-in-part of application No. 09/679,718, filed on Sep. 29, 2000, now Pat. No. 6,438,199, and a continuation-in-part of application No. 10/150,650, filed on May 17, 2002, now Pat. No. 7,006,595, said application No. 09/679,718 and a continuation-in-part of application No. 09/305,017, filed on May 4, 1999, now Pat. No. 6,198,793, , said application No. 10/150,650 is a continuation-in-part of application No. 09/679,718.

(30) Foreign Application Priority Data

| May 5, 1998 | (DE) | ................................. 198 19 898 |
| Feb. 2, 1999 | (DE) | ................................. 199 03 807 |
| Feb. 8, 1999 | (DE) | ............................ 299 02 108 U |
| Feb. 26, 1999 | (DE) | ................................. 199 08 526 |
| Jul. 28, 2000 | (WO) | ..................... PCT/EP00/07258 |
| Jul. 30, 2003 | (DE) | ................................. 103 34 722 |

(51) Int. Cl.
*A61G 5/00* (2006.01)

(52) U.S. Cl. .............. 250/492.1; 250/306; 250/492.22; 250/492.23

(58) Field of Classification Search .............. 250/492.1
See application file for complete search history.

(56) References Cited

U.S. PATENT DOCUMENTS 4,195,913 A    4/1980    Dourte et al. ................ 350/292

(Continued)

FOREIGN PATENT DOCUMENTS

EP    0066295 A1    12/1982

(Continued)

OTHER PUBLICATIONS

Murphy et al., "Synchrotron Radiation Sources and Condensers for Projection X-Ray Lithography", Applied Optics, vol. 32, No. 34, pp. 6920-6929 (Dec. 1, 1993).

(Continued)

*Primary Examiner*—Frank G. Font
*Assistant Examiner*—Mary El-Shammaa
(74) *Attorney, Agent, or Firm*—Ohlandt, Greeley, Ruggiero & Perle, L.L.P.

(57) ABSTRACT

This invention relates to an Ilumination system for scanning lithography especially for wavelengths $\leqq 193$ nm, particularly EUV lithography, for the illumination of a slit, comprising at least one field mirror or at least one field lens and being characterized in that at least one of the field mirror(s) or the field lens(es) has (have) an aspheric shape.

33 Claims, 22 Drawing Sheets

U.S. PATENT DOCUMENTS

| | | | |
|---|---|---|---|
| 4,294,538 A | 10/1981 | Ban | 355/51 |
| 4,389,115 A | 6/1983 | Richter | 355/26 |
| 4,651,012 A | 3/1987 | Clark et al. | 250/505.1 |
| 4,688,932 A | 8/1987 | Suzuki | 355/51 |
| 4,740,276 A | 4/1988 | Marmo et al. | 204/7 |
| 5,071,240 A | 12/1991 | Ichihara et al. | 359/366 |
| 5,142,561 A | 8/1992 | Doumas | 378/84 |
| 5,148,442 A | 9/1992 | O'Neil et al. | 372/71 |
| 5,222,112 A | 6/1993 | Terasawa et al. | 378/34 |
| 5,339,346 A | 8/1994 | White | 378/34 |
| 5,361,292 A | 11/1994 | Sweatt | 378/34 |
| 5,402,267 A | 3/1995 | Fürter et al. | 359/727 |
| 5,439,781 A | 8/1995 | MacDowell et al. | 460/311 |
| 5,440,423 A | 8/1995 | Ogura | 359/365 |
| 5,459,547 A | 10/1995 | Shiozawa | 355/67 |
| 5,512,759 A | 4/1996 | Sweatt | 250/492.1 |
| 5,581,605 A | 12/1996 | Murakami et al. | 378/84 |
| 5,640,284 A | 6/1997 | Tanitsu et al. | 359/869 |
| 5,644,383 A | 7/1997 | Mori | 355/68 |
| 5,647,664 A | 7/1997 | Hanečka | 362/308 |
| 5,669,708 A | 9/1997 | Mashima et al. | 362/341 |
| 5,677,939 A | 10/1997 | Oshino | 378/34 |
| 5,715,084 A | 2/1998 | Takahashi et al. | 359/487 |
| 5,737,137 A | 4/1998 | Cohen et al. | 359/859 |
| 5,755,503 A | 5/1998 | Chen et al. | 353/38 |
| 5,796,524 A * | 8/1998 | Oomura | 359/633 |
| 5,805,356 A | 9/1998 | Chiba | 359/727 |
| 5,805,365 A * | 9/1998 | Sweatt | 359/858 |
| 5,815,310 A * | 9/1998 | Williamson | 359/365 |
| 5,846,678 A | 12/1998 | Nishigori et al. | 430/30 |
| 5,896,438 A | 4/1999 | Miyake et al. | 378/34 |
| 5,963,305 A | 10/1999 | Mizouchi | 355/67 |
| 5,993,010 A | 11/1999 | Ohzawa et al. | 353/99 |
| 5,995,582 A | 11/1999 | Terashima et al. | 378/34 |
| 6,081,319 A * | 6/2000 | Ozawa et al. | 355/67 |
| 6,198,793 B1 * | 3/2001 | Schultz et al. | 378/34 |
| 6,208,707 B1 | 3/2001 | Oshino | 378/34 |
| 6,229,647 B1 | 5/2001 | Takahashi et al. | 359/487 |
| 6,243,206 B1 * | 6/2001 | Wangler | 359/621 |
| 6,339,467 B1 | 1/2002 | Sato | 355/77 |
| 6,400,794 B1 | 6/2002 | Schultz et al. | 378/34 |
| 6,438,199 B1 | 8/2002 | Schultz et al. | 378/34 |
| 6,507,440 B1 | 1/2003 | Schultz | 359/626 |
| 6,583,937 B1 | 6/2003 | Wangler et al. | 359/624 |
| 6,594,334 B1 | 7/2003 | Ota | 378/34 |
| 6,631,036 B1 * | 10/2003 | Schuster | 359/726 |
| RE38,438 E | 2/2004 | Takahashi | 359/727 |

FOREIGN PATENT DOCUMENTS

| | | |
|---|---|---|
| EP | 0359018 A2 | 3/1990 |
| EP | 0939341 A2 | 9/1999 |
| EP | 1026547 A2 | 8/2000 |
| EP | 1 067 437 A2 | 1/2001 |
| EP | 1434240 A1 | 6/2004 |
| JP | 02180013 | 12/1990 |
| WO | WO 99/57732 | 11/1999 |

OTHER PUBLICATIONS

"Handbook on Synchrotron Radiation", Ernst-Echard Koch ed., pp. 140-145, 1098-1111 (1983).

* cited by examiner

Fig.11
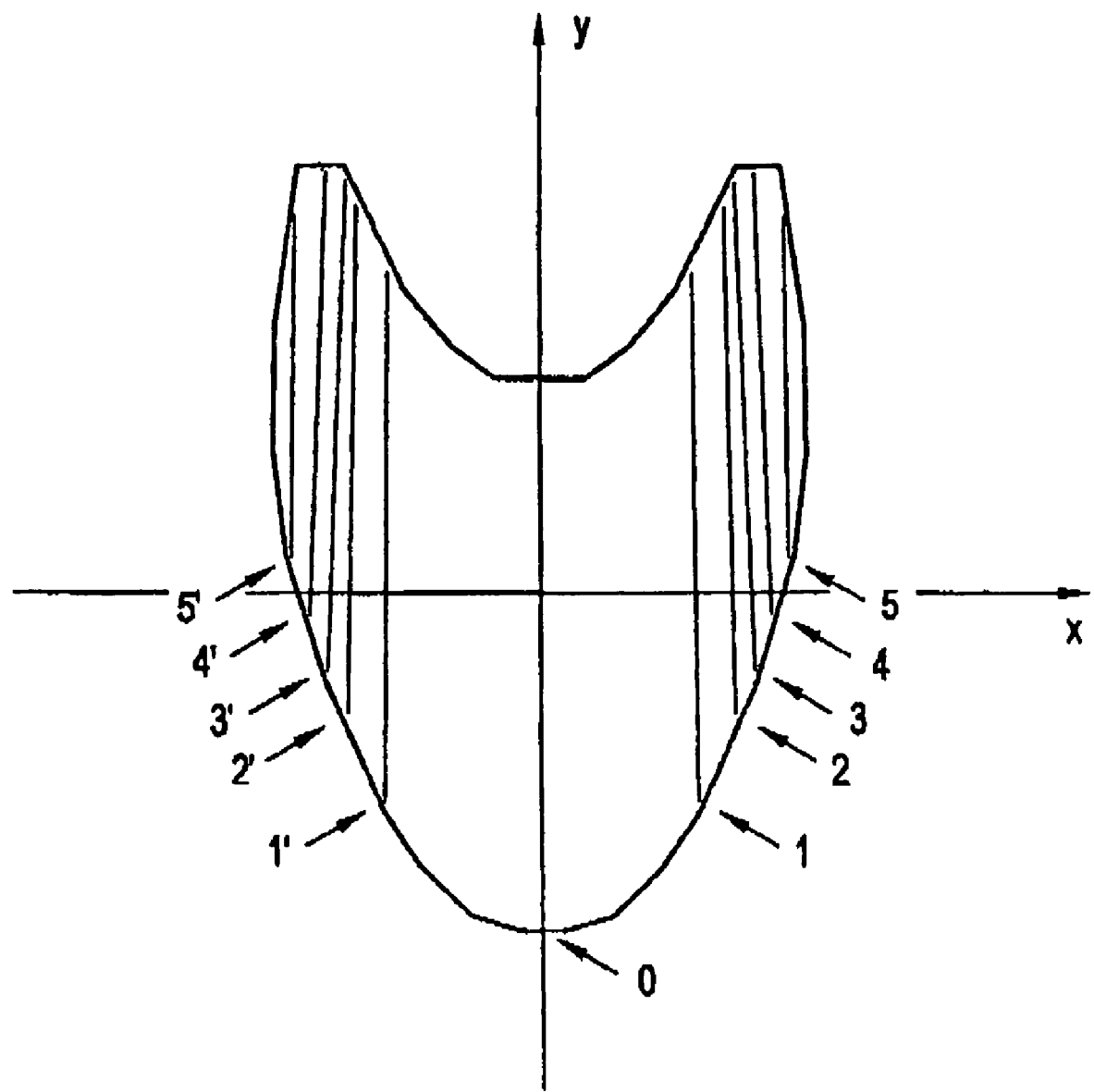
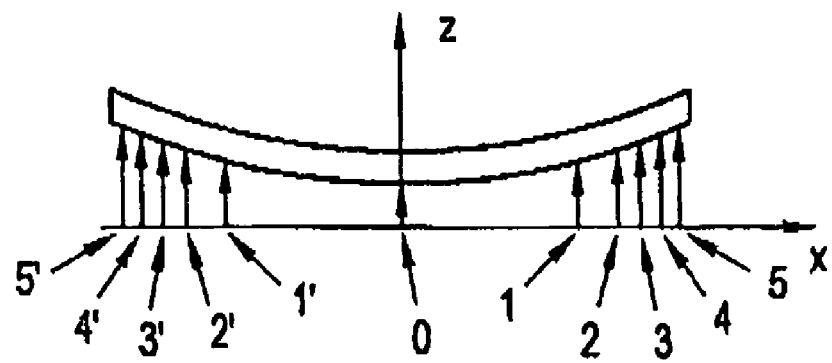

ILLUMINATION SYSTEM WITH FIELD MIRRORS FOR PRODUCING UNIFORM SCANNING ENERGY

CROSS-REFERENCE TO RELATED APPLICATIONS

The present application is a continuation-in-part of application Ser. No. 09/514,040, filed Feb. 25, 2000, now U.S. Pat. No. 6,770,894 and also a continuation-in-part of application Ser. No. 10/201,652, filed Jul. 22, 2002; now U.S. Pat. No. 6,859,328 application Ser. No. 10/201/652 is a continuation-in part of application Ser. No. 09/679,718, filed Sep. 29, 2000, U.S. Pat. No. 6,438,199, and also a continuation-in part of application Ser. No. 10/150,650, filed May 17, 2002; now U.S. Pat. No. 7,006,595 application Ser. No. 09/679,718 is a continuation-in-part of application Ser. No. 09/305,017, filed May 4, 1999, U.S. Pat. No. 6,198,793; and application Ser. No. 10/150,650 is a continuation-in-part of application Ser. No. 09/679,718.

The present application is also claiming priority of:

(a) International Application No. PCT/EP00/07258, filed Jul. 28, 2000;

(b) German Application No. 299 02 108.4, filed Feb. 8, 1999;

(c) German Application No. 199 03 807.4, filed Feb. 2, 1999;

(d) German Application No. 198 19 898.1, filed May 5, 1998;

(e) German Application No. 199 08 526.9 filed Feb. 26,1999; and (f) German Application No. 103 34 722.4 filed Jul. 30, 2003.

BACKGROUND OF THE INVENTION

1. Field of the Invention

This invention relates to an illumination system, and more particularly to an illumination system for EUV lithography with wavelengths less than 193 nm.

2. Description of the Prior Art

To reduce the structural widths for electronic components, especially in the submicron range, it is necessary to reduce the wavelength of the light used for microlithography. For example, lithography with soft x-rays is conceivable with wavelengths smaller than 193 nm. U.S. Pat. No. 5,339,346 disclosed an arrangement for exposing a wafer with such radiation. An illumination system for soft x-rays, so-called EUV radiation, is shown in U.S. Pat. No. 5,737,137, in which illumination of a mask or a reticle to be exposed is produced using three spherical mirrors.

Field mirrors that show good uniformity of output of an exposure beam at a wafer in a lithographic system have been disclosed in U.S. Pat. No. 5,142,561. The exposure systems described therein concern the contact exposure of a wafer through a mask with high-energy x-rays of 800 to 1800 eV.

EUV illumination systems for EUV sources have been disclosed in EP 99 106 348.8 (U.S. application Ser. No. 09/305017) and PCT/EP99/02999. These illumination systems are adapted to synchrotron, wiggler, undulator, Pinch-Plasma or Laser-Produced-Plasma sources.

Scanning uniformity is a problem of the aforementioned scanning exposure systems in illuminating a slit, particularly a curved slit. For example, the scanning energy obtained as a line integral over the intensity distribution along the scan path in a reticle or wafer plane may increase toward the field edge despite homogeneous illumination intensity because of the longer scan path at the field edge for a curved slit. However, scanning energy and with it scanning uniformity may also be affected by other influences, for example coating or vignetting effects are possible. The curved slit is typically represented by a segment of a ring field, which is also called an arc shaped field. The arc shaped field can be described by the width delta r, a mean Radius $R_0$ and the angular range $2 \cdot \alpha_0$. For example, the rise of the scanning energy for a typical arc shaped field with a mean radius of R=100 mm and an angular range of $2 \cdot \alpha_0 = 60°$ is 15%.

SUMMARY OF THE INVENTION

It is an object of the present invention to provide an illumination system for a projection exposure system in which the scanning energy is uniform, or can be controlled to fit a predetermined curve.

It is a further object of the present invention to provide an error-free illumination of the exit pupil in the pupil plane which is as field-independent as possible and is even over the field, as is required in high-performance lithography systems, meaning that the coherence parameters set over the field do not change.

This and other objectives of the present invention are achieved by shaping a field lens group in an illumination system of a generic type so that the illuminated field is distorted in an image plane of the illumination system perpendicular to the scanning direction. In this plane the mask or reticle of a projection exposure system is located.

The term "field lens group" is taken to describe both field mirror(s) and field lens(es). For wavelengths $\lambda > 100$ nm the field lens group typically comprises refractive field lens(es), but mirrors are also possible. For wavelengths in the EUV region (10 nm<$\lambda$<20 nm) the field lens group comprises reflective field mirror(s). EUV lithography uses wavelengths between 10 nm and 20 nm, typically 13 nm.

According to the present invention it is possible to determine the necessary distortion to obtain a predetermined intensity distribution. It is advantageous for a scanning system to have the capability of modifying the intensity distribution perpendicular to the scanning direction to get a uniform distribution of scanning energy in the wafer plane. The scanning energy can be influenced by varying the length of the scanning path or by modifying the distribution of the illumination intensity. The present invention relates to the correction of the distribution of the illumination intensity. In comparison to stepper systems where a two-dimensional intensity distribution has to be corrected, a scanner system only requires a correction of the distribution of the scanning energy.

In one embodiment of the present invention, the illumination intensity decreases from the center of the field to the field edges by means of increasing distortion. The intensity is maximum at the field center ($\alpha=0°$) and minimum at the field edges ($\alpha=\pm\alpha_0$). A decrease of the illumination intensity towards the field edge permits a compensation for an increase of the scan path so that the scanning energy remains homogeneous.

The present invention also provides for the illumination intensity to increase from the center of the field to the field edges by means of decreasing distortion. This correction can be necessary if other influences like layer or vignetting effects lead to a decreasing scanning energy towards the field edges.

Preferably, the field lens group is designed so that uniformity of scanning energy in the range of ±7%, preferably ±5%, and very preferably ±3%, is achieved in the image plane of the illumination system.

The field lens group is shaped so, that the aperture stop plane of the illumination system is imaged into a given exit pupil of the illumination system. In addition to the intensity correction, the field lens group achieves the correct pupil imaging. The exit pupil of the illumination system is typically given by the entrance pupil of the projection objective. For projection objectives, which do not have a homocentric entrance pupil, the location of the entrance pupil is field dependent. In such a case, the location of the exit pupil of the illumination system is also field dependent.

The shape of the illuminated field according to this invention is rectangular or a segment of a ring field. The field lens group is preferably shaped such that a predetermined shaping of the illuminated field is achieved. If the illuminated field is bounded by a segment of a ring field, the design of the field lens group determines the mean radius $R_0$ of the ring field.

It is advantageous to use a field lens group having an anamorphotic power. This can be realized with toroidal mirrors or lenses so that the imaging of the x- and y-direction can be influenced separately.

In EUV systems the reflection losses for normal incidence mirrors are much higher than for grazing incidence mirrors. Accordingly, the field mirror(s) is (are) preferably grazing incidence mirror(s).

In another embodiment of the present invention the illumination system includes optical components to transform the light source into secondary light sources. One such optical component can be a mirror that is divided into several single mirror elements. Each mirror element produces one secondary light source. The mirror element can be provided with a plane, spherical, cylindrical, toroidal or an aspheric surface. Theses single mirror elements are called field facets. They are imaged in an image plane of the illumination system where the images of the field facets are at least partly superimposed.

For extended light sources or other purposes it can be advantageous to add a second mirror that is divided in several single mirror elements. Each mirror element is located at a secondary light source. These mirror elements are called pupil facets. The pupil facets typically have a positive optical power and image the corresponding field facets into the image plane.

The imaging of the field facets into the image plane can be divided into a radial image formation and an azimuthal image formation. The y-direction of a field facet is imaged in the radial direction, and the x-direction is imaged in the azimuthal direction of an arc shaped field. To influence the illumination intensity. perpendicular to the scanning direction the azimuthal image formation will be distorted.

The imaging of the field facets is influenced by the field lens group. It is therefore advantageous to vary the azimuthal distortion by changing the surface parameters of the components of the field lens group.

The field lens group is shaped such that the secondary light sources produced by the field facets are imaged into a given exit pupil of the illumination system.

With a static design of the field lens group, a given distribution of the illumination intensity, the shaping of the illuminated field and the pupil imaging can be realized. The effects that are known can be taken into account during the design of the field lens group. But there are also effects that cannot be predicted. For example, the coatings can differ slightly from system to system. There are also time dependent effects or variations of the illumination intensity due to different coherence factors, so called setting dependent effects. Therefore, actuators on the field mirror(s) are preferably provided in order to control the reflective surface(s).

The distortion, and thus the illumination intensity, can be modified using the actuators. Since the surface changes also affect the pupil imaging, intensity correction and pupil imaging are regarded simultaneously. The surface changes are limited by the fact that the directions of centroid rays that intersect the image plane are changed less than 5 mrad, preferably less than 2 mrad, and very preferably less than 1 mrad.

It is advantageous to reduce the number of surface parameters to be controlled. To influence the illumination intensity, and thus the scanning intensity, only the surface parameters that influence the shape of the mirror surface(s) perpendicular to the scanning direction will be modified. These are the x-parameters if the scanning direction is the y-direction.

A particularly simple arrangement is obtained when the actuators for controlling the field mirror surface are placed parallel to the scan direction or the y-axis of the field mirror, for example in the form of a line or beam actuator.

In further developed embodiment a field lens or field mirror is provided which is preferably sufficiently corrected in an aplanatic manner and realizing a uniformly illuminated field with a high telecentricity. Preferably this is achieved by shaping at least one of the field lenses or field mirrors, respectively, to have an inclined aspheric shape.

The present invention also provides for a projection exposure system for microlithography using the previously described illumination system. A mask or reticle is arranged in the image plane of the illumination system, which is also an interface plane between the illumination system and projection system. The mask will be imaged into a wafer plane using a projection objective.

The illumination of the wafer is typically telecentric. This means that the angles of the chief rays regarding the wafer plane are smaller than ±5 mrad. The angle distribution of the chief rays in the reticle plane is given by the lens design of the projection objective. The directions of the centroid rays of the illumination system must be well adapted to the directions of the chief rays of the projection system in order to obtain a continuous ray propagation. The telecentricity requirement is fulfilled in this invention when the angular difference between the centroid rays and the chief rays does not exceed a given degree in the plane of the reticle, for example ±10.0 mrad, preferably ±4.0 mrad, and very preferably 1.0 mrad.

For scanning lithography it is very important that the scanning energy in the wafer plane is uniform. With the previously described illumination system it is possible to achieve uniformity values of scanning energy in the wafer plane in the range of ±7%, preferably ±5%, and very preferably ±3%.

The present invention also provides for a method for calculating the magnification $\beta_s$ for the azimuthal imaging of the field facets for a predetermined distribution of scanning energy. With the knowledge of the azimuthal magnification $\beta_s$ the design of the field lens group can be determined.

If the predicted distribution of scanning energy in the wafer plane is not obtained, the scanning energy can be corrected using the actuators of the field mirror(s). From the difference between the predicted and measured distribution of scanning energy the magnification for the azimuthal imaging of the field facets, and thus the necessary surface corrections, can be calculated.

The present invention will be more fully understood from the detailed description given hereinafter and the accompanying drawings, which are given by way of illustration only and are not be considered as limiting the present invention. Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will be apparent to those skilled in the art from this detailed description.

BRIEF DESCRIPTION OF THE DRAWINGS

FIG. 11 is a graph of an arrangement of actuators for dynamic control of a surface form of a second field mirror in plan view and side view.

DESCRIPTION OF THE INVENTION

Figure 1:
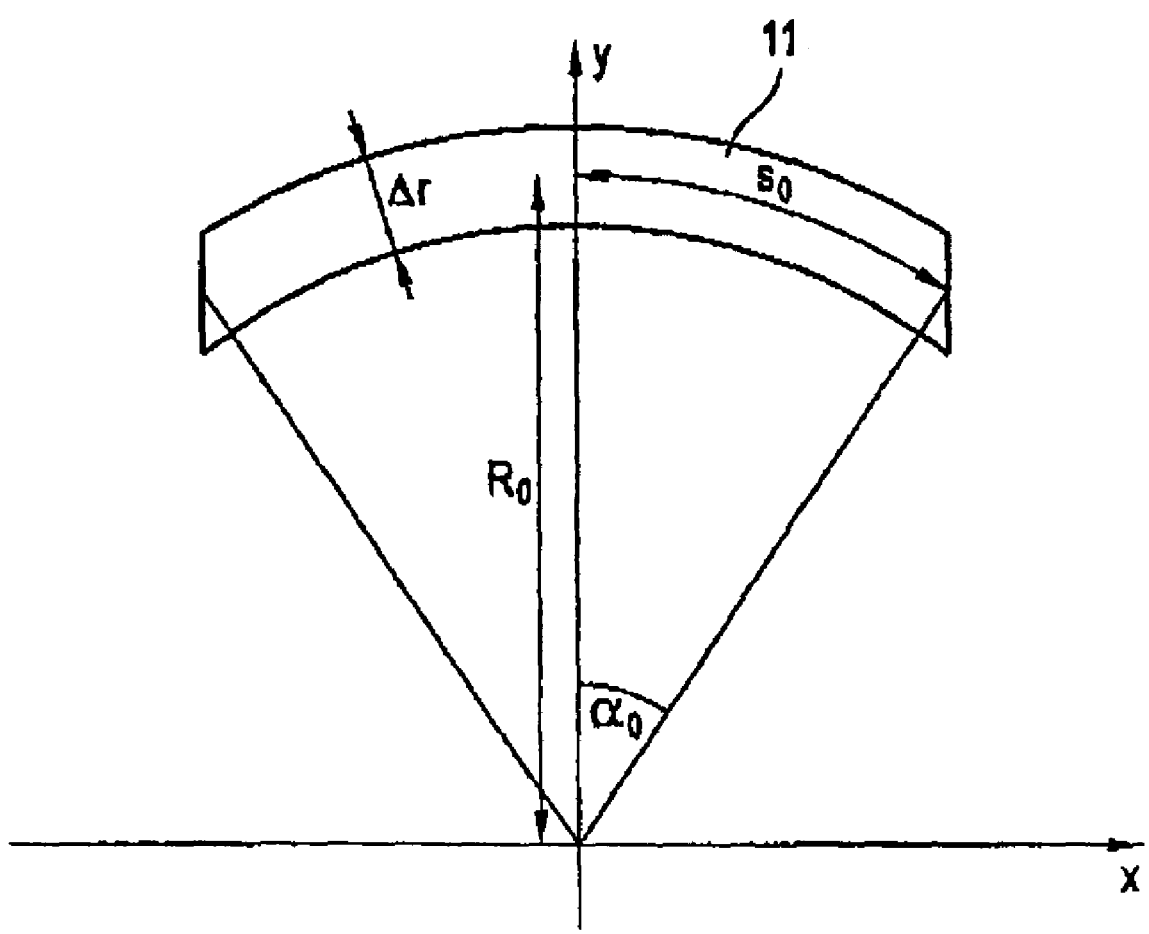
FIG. 1 is a graph of an arc shaped field for an EUV illumination system.

The illumination systems pursuant to the invention described below illuminate a segment of a ring field as shown in FIG. 1. An arc shaped field 11 in a reticle plane is imaged into a wafer plane by a projection objective.

According to FIG. 1, the width of the arc shaped field 11 is $\Delta r$ and the mean radius is $R_0$. The arc shaped field extends over an angular range of $$2 \cdot \alpha_0$$

and an arc of $$2 \cdot s_0.$$

The angle $\alpha_0$ is defined from the y-axis to the field edge, the arc length $s_0$ is defined from the center of the field to the field edge along the arc at the mean radius $R_0$.

The scanning energy SE(x) at x is found to be the line integral over the intensity E(x,y) along the scan direction, which is the y-direction in this embodiment:

$$SE(x) = \int_{x=const} E(x, y) dy$$

in which E(x,y) is the intensity distribution in the x-y plane.

Each point on the reticle or wafer contains the scanning energy SE(x) corresponding to its x coordinate. If uniform exposure is desired, it is advantageous for the scanning energy to be largely independent of x. In photolithography, it is desirable to have a uniform scanning energy distribution in the wafer plane. The resist on the wafer is very sensitive to the level of light striking the wafer plane. Preferably, each point on the wafer receives the same quantity of light or the same quantity of scanning energy.

Figure 2:
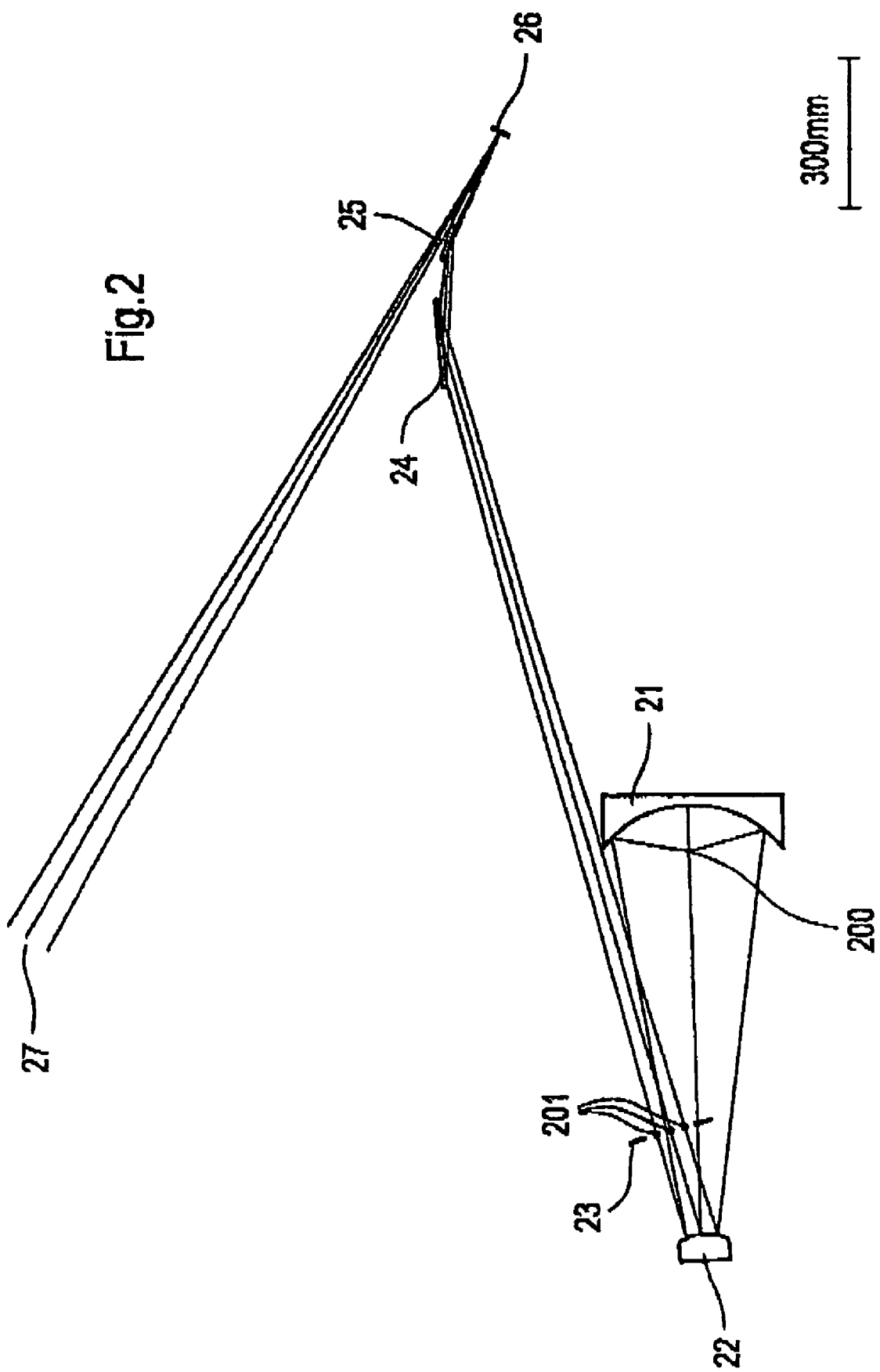
FIG. 2 is a side view of an EUV illumination system, in accordance with the present invention.

As described below, the scanning energy can be controlled by the design of the field lens group. By way of example, an EUV illumination system is shown in FIG. 2. In this embodiment a Laser-Produced-Plasma source 200 is used to generate the photons at λ=13 nm. The light of the source is collected with an ellipsoidal mirror 21 and directed to a first mirror 22 comprising several rectangular mirror elements. The single mirror elements are called field facets, because they are imaged in an image plane 26 of the illumination system. In this embodiment the field facets are plane mirror elements in which each field facet is tilted by a different amount. The ellipsoidal mirror 21 images the light source 200 in an aperture stop plane 23. Due to the tilted field facets, the image of the light source is divided into several secondary light sources 201 so that the number of secondary light sources 201 depends on the number of tilted field facets. The secondary light sources 201 are imaged in an exit pupil 27 of the illumination system using a field mirror 24 and a field mirror 25. The location of the exit pupil 27 depends on the design of the projection objective, which is not shown in FIG. 2. In this embodiment, the field mirrors 24 and 25 are grazing incidence mirrors with a toroidal shape. The imaging of the field facets in the image plane 26 is influenced by the field mirrors 24 and 25. They introduce distortion to shape the arc shaped images of the rectangular field facets and to control the illumination intensity in the plane of the image plane 26, where a reticle is typically located. This will be further explained below. The tilt angles of the field facets are chosen to overlay the arc shaped images of the field facets at least partly in the image plane 26.

The embodiment of FIG. 2 is only an example. The source is not limited to Laser-Produced-Plasma sources. Lasers for wavelength≦193 nm, Pinch Plasma sources, synchrotrons, wigglers or undulators for wavelength between 10-20 nm are also possible light sources. The collector unit is adapted for the angular and spatial characteristic of the different light sources. The illumination system does not need to be purely reflective. Catadioptric or dioptric components are also possible.

Figure 3:
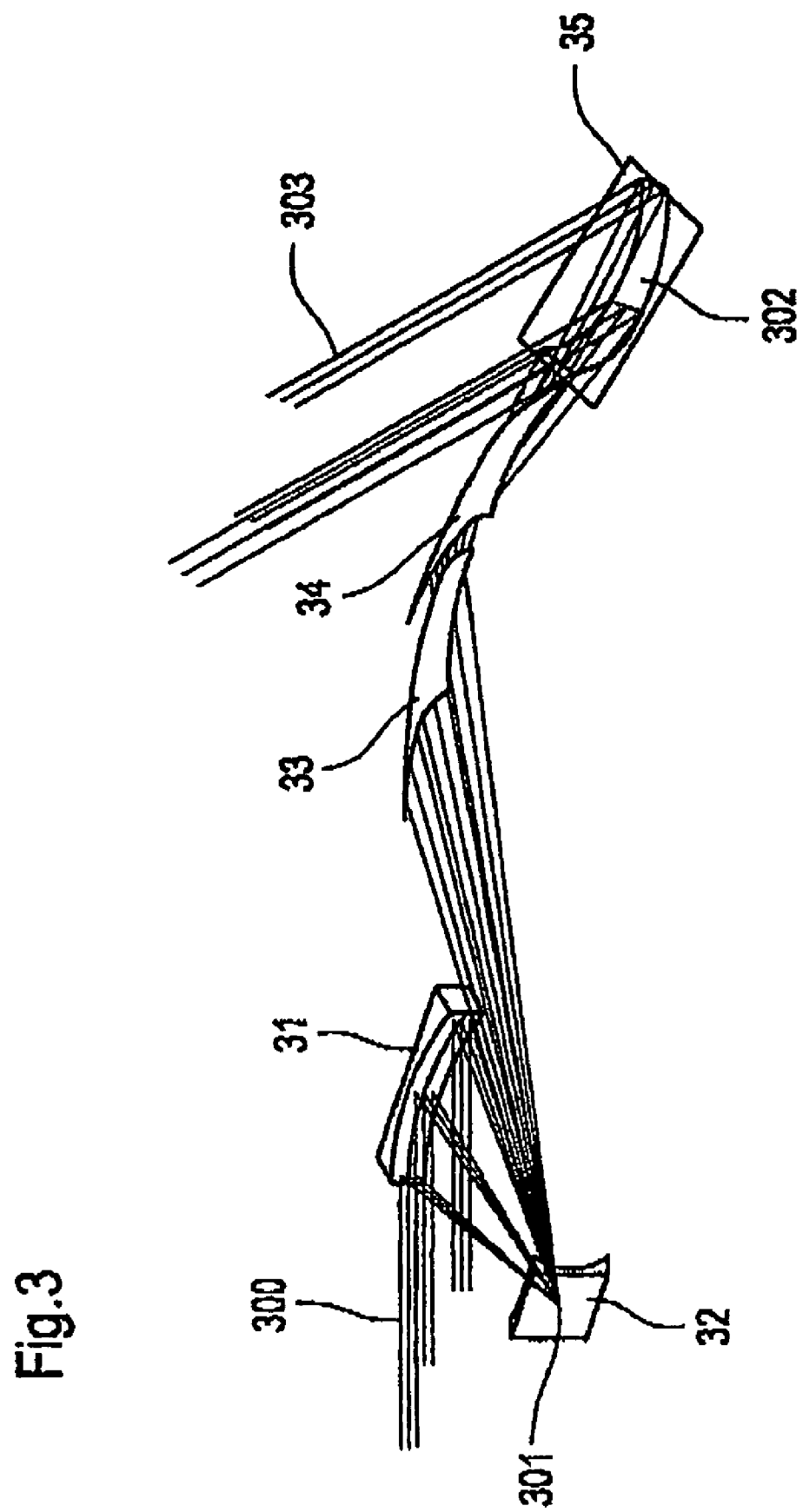
FIG. 3 is a top perspective view of an imaging of a central field facet to a plane of a reticle using pupil facets and field mirrors in accordance with the present invention.

FIG. 3 shows, in a schematic three-dimensional view, the imaging of one field facet 31 to an image plane 35. The beam path of this central field facet 31 located on the optical axis is representative of all other field facets. An incoming beam 300 is focused to a secondary light source 301 using the field facet 31. The field facet 31 is in this case a concave mirror element. The secondary light source 301 is spot-like if a point source is used. The beam diverges after the secondary light source 301. Without a field mirror 33 and a field mirror 34, the image of the rectangular field facet 31 would be rectangular. The imaging of the field facet 31 is distorted to produce an arc shaped field 302. The distortion is provided by the field mirrors 33 and 34. Two mirrors are necessary to produce the proper orientation of the arc. A reflected beam 303 is focused at the exit pupil of the illumination system using the field mirrors 33 and 34. The exit pupil is not shown in FIG. 3. The field mirrors 33 and 34 image the secondary light source 301 into the exit pupil.

For real sources the secondary light source 301 is extended. To get a sharp image of the field facet 31 it is advantageous to image the field facet 31 into the image plane 35 using another mirror 32. The mirror 32 located at the secondary light source 301 is called a pupil facet and has a concave surface. Each secondary light source has such a pupil facet. FIG. 3 shows a light path for one pair of field facet 31 and pupil facet 32. In a case of a plurality of field facets 31, there is a corresponding number of pupil facets 32, which are located at the plane of the secondary light sources. In such a case, the plurality of mirror elements 32 forms another faceted mirror.

The term "entendue" refers to a phase-space volume of a light source. Pupil facets are necessary only for extended light sources, which have a high entendue value. In the case of a point source, the secondary light source is also a point, and a pupil facet would have no influence on the imaging. In FIG. 2 the source diameter of the Laser-Produced-Plasma source 200 is only 50 μm, so the pupil facets are not required. For higher source diameters the mirror with the pupil facets is added at the aperture stop plane 23. To eliminate vignetting, the tilt angle of the mirror 22 with the field facets is increased.

The field mirrors 24, 25, 33, 34 shown in FIGS. 2 and 3 form the arc shaped field 302, image the plane of the aperture stop 23 in the exit pupil plane 27 of the illumination system, and control the illumination distribution in the arc shaped field 302.

As will be described in the following paragraphs, the imaging of the central field facet shown in FIG. 3 is used to optimize the design of the field mirrors 33 and 34. The form of the images of other field facets is determined by a field lens group nearly in the same way as for the central field facet 31. Thus, the design of the field lens group, which in turn controls the scanning energy, can be optimized through the imaging of the central field facet 31. This facet can be considered as a homogeneously radiating surface. In the real system with all field facets homogeneity results from the superimposition of the images of all field facets.

When optimizing the design of the field lens group, the goals include controlling the scanning energy, producing an arc shaped field, and imaging of the plane with secondary light sources to an exit pupil of the illumination system. The given components include a first mirror with field facets 31, a second mirror with pupil facets 32, a field lens group including mirror 33 and mirror 34, image plane 35 and an exit pupil plane (not shown in FIG. 3). The field lens group, in this case the shapes of mirror 33 and mirror 34, will be designed. Without the field lens group, the shape of the illuminated field in image plane 35 would be rectangular, the illuminated field would not be distorted, and there would be no pupil imaging.

As a first step, the complexity of the process of designing the field lens group is reduced by considering the imaging of only the central field facet 31, rather than considering all of the facets. Facet 31 is imaged to image plane 35 using pupil facet 32. The design of the field lens group requires (1) controlling the scanning energy by introducing distortion perpendicular to the scanning direction, (2) producing an arc shaped field, and (3) imaging the secondary light sources 301 to the exit pupil of the illumination system. The field lens group only influences the field facet imaging by distorting this imaging. The main component of the field facet imaging is due to the pupil facet 32 (or to a camera obscura).

As a second step, a simulation is constructed for all the field facets, the pupil facets and the field lens group designed in the first step. Normally, the field lens group influences the imaging of the other field facets in a manner similar to that of the imaging of the central field facet. If the imaging is not similar, the design of the field lens group must be corrected. Such corrections are typically small.

A superimposition of the images of all field facets results in intensity homogeneity in the image plane. This is similar to the principle of a fly-eye integrator. Since the central field facet is representative of all field facets, design complexity is reduced by considering only the central field facet. To simulate the intensity distribution in the image plane only with a central light channel defined by field facet 31 and pupil facet 32, the central field facet 31 is regarded as a homogeneous radiating surface.

Figure 4:
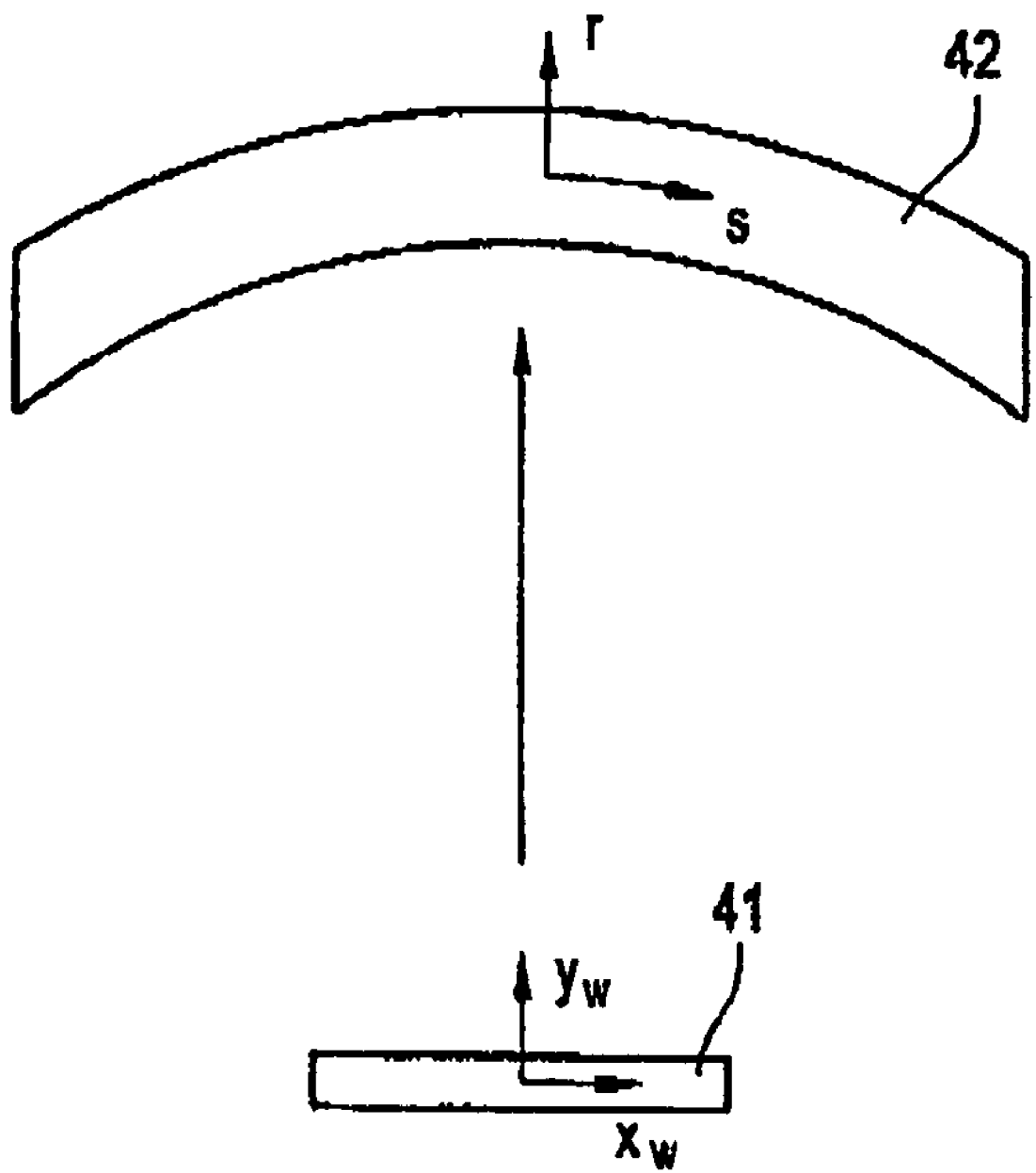
FIG. 4 is an illustration of a transformation of a rectangular field in an arc shaped field in accordance with the present invention.

FIG. 4 shows, schematically, an imaging of a rectangular field 41 on an arc shaped field 42 at an image plane of an illumination system. The rectangular field 41 can be a homogeneously radiating real or virtual surface in a plane conjugated to a reticle plane. FIG. 4 shows the correlation between rectangular field 41 and arc shaped field 42, and it also shows the orientation and definition of the coordinate system. The description of the scanning energy control, as set forth in the following pages, is independent of the design layout of the field facets or pupil facets. Accordingly, only a homogeneously radiating rectangular field is being considered. In FIG. 3, the rectangular field is given by central field facet 31.

A length $x_w$ at the rectangular field 41 is imaged on an arc length s at the arc shaped field 42, and a length $y_w$ is imaged on a radial length r. The origin of the coordinate systems is the center of the field for the rectangular field 41 and the optical axis for the arc shaped field 42.

When the field lens group consists of mirror(s) or lens(es) with anamorphotic power, for example toroidal mirrors or lenses, the image formation can be divided into two components $\beta_s$ and $\beta_{rad}$:

$$\beta_s : x_w \to s$$

$$\beta_{rad} : y_w \to r$$

wherein $\beta_{rad}$: radial imaging of $y_w$ on r
$\beta_s$: azimuthal imaging of $x_w$ on s
$(x_w, y_w)$: horizontal and vertical coordinates of a field point on the rectangular field 41.
(s, r): radial and azimuthal coordinates of a field point on the arc shaped field 42.

Assuming a homogeneous intensity distribution $$E_w(x,y) = E_w^0$$

in the x-y plane of the rectangular field, the intensity distribution $$E_r(s,r)$$

in the plane of the arc shaped field 42 is obtained by the influence of the field lens group. The index w below stands for the plane of the rectangular field, the index r below stands for the plane of the arc shaped field. If the azimuthal image formation $\beta_s$ is free of distortion, the intensity distribution in the plane of the reticle is also homogeneous $$E_r(x,y) = E_r^0.$$

Since the scan path increases towards the edge of the field, the scanning energy $SE(x_r)$ in the plane of the reticle is a function of $x_r$.

$$SE(x_r) = E_r^0 \int_{Scan\ path\ at\ x_r} dy$$

The following equation applies:

$$SE(x_r) = E_r^0 \int_{Scan\ path\ at\ x_r} dy = E_r^0 \cdot \left( \sqrt{\left(R_0 + \frac{\Delta r}{2}\right)^2 - x_r^2} - \sqrt{\left(R_0 - \frac{\Delta r}{2}\right)^2 - x_r^2} \right)$$

For $\Delta r < R_0$ and $x_r < R_0$, this equation can be expanded in a Taylor series, which is discontinued after the first order:

$$SE(x_r) = E_r^0 \int_{Scan\ path\ at\ x_r} dy = E_r^0 \cdot \frac{1}{\sqrt{1 - \left(\frac{x_r}{R_0}\right)^2}}$$

The following parameters can be assumed for the arc shaped field 42 by way of example:

$R_0 = 100.0$ mm
$\Delta r = 6.0$ mm; $-3.0$ mm $\leq r \leq 3.0$ mm
$\alpha_0 = 30°$ With homogeneous intensity distribution $E_r^0$ the scanning energy $SE(x_r)$ rises at the edge of the field $x_r = 50.0$ mm, to $$SE(x_r = 50.0\ mm) = 1.15 \cdot SE(x_r = 0.0) = SE_{max}.$$

The uniformity error produced is thus $$\text{Uniformity [\%]} = 100\% \cdot \frac{SE_{max} - SE_{min}}{SE_{max} + SE_{min}} = 7.2\%.$$

The maximum scanning energy $SE_{max}$ is obtained at the field edge ($x_r = 50.0$ mm), the minimum scanning energy $SE_{min}$ is obtained at the center of the field ($x_r = 0.0$).

With
$R_0 = 200.0$ mm
$\Delta r = 6.0$ mm; $-3.0$ mm $\leq r \leq 3.0$ mm
$\alpha_0 = 14.5°$ we obtain $$SE(x_r = 50.0) = 1.03 \cdot SE(x_r = 0.0).$$

The uniformity error produced is thus $$\text{Uniformity [\%]} = 100\% \cdot \frac{SE_{max} - SE_{min}}{SE_{max} + SE_{min}} = 1.6\%.$$

The rise of the scanning energy toward the edge of the field is considerably smaller for larger radius $R_0$ of the arc shaped field 42 and smaller arc angles $\alpha_0$.

The uniformity can be substantially improved pursuant to the invention if the field lens group is designed so that the image formation in the plane of the reticle is distorted azimuthally, i.e., a location-dependent magnification $$\beta_S(x_W) = \frac{s}{x_W} \text{ is}$$

introduced.

It is generally true that the intensity of irradiation E is defined as the quotient of the radiation flux $d\Phi$ divided by the area element dA struck by the radiation flux, thus:

$$E = \frac{d\Phi}{dA}$$

The area element for the case of the arc shaped field is given by $$A = ds \cdot dr$$

ds: arc increment.
dr: radial increment.

If the azimuthal image formation is distorted, the distorted intensity $E_r^v$ in the plane of the reticle behaves as the reciprocal of the quotient of the distorted arc increment $ds^v$ divided by the undistorted arc increment $ds^{v=0}$:

$$\frac{E_r^V}{E_r^{V=0}} = \frac{dr \cdot ds^{V=0}}{dr \cdot ds^V} = \frac{1}{\frac{ds^V}{ds^{V=0}}}$$

Since with undistorted image formation the arc increment $ds^{v=0}$ is proportional to the x-increment $dx_w$ at the rectangular field 41

$$ds^{v=0} \propto dx_w,$$

it follows that $$E_r^V \propto \frac{1}{\frac{ds^V}{dx_w}}$$

The intensity $E_r^v(x_r)$ in the plane of the reticle can be controlled by varying the quotient $$\frac{ds^V}{dx_w}.$$

The relationship between scanning energy $SE(x_r)$ and azimuthal imaging magnification $\beta_s$ is to be derived as follows:

$$SE(x_r) = \int_{\substack{Scan\,path \\ at\,x_r}} E(x_r, y_r) \, dy$$

The intensity $E(x_r, y_r)$ can be written as the product of the functions $g(r)$ and $f(s)$. The function $g(r)$ is only dependent on the radial direction r, the function $f(s)$ is only dependent on the azimuthal extent s:

$$E(x_r, y_r) = g(r) \cdot f(s).$$

For $\Delta r < R$ and $\Delta r < x_r$, $g(r)$ should be independent of the x-position $x_r$ in the plane of the reticle and $f(s)$ should be independent of the y-position $y_r$ in the plane of the reticle.

Since s and x, from $$\sin\left(\frac{s}{R_0}\right) = \frac{x_r}{R_0}$$

are directly coupled to one another, $SE(x_r)$ can also be written as a function of s:

$$SE(s) = \int_{\substack{Scan\,path \\ at\,s(x_r)}} f(s) \cdot g(r) \, dy$$

Since $f(s)$ is independent of $y_r$, it follows that:

$$SE(s) = f(s) \cdot \int_{\substack{Scan\,path \\ at\,s}} g(r) \, dy$$

and since $$\frac{dr}{dy_r} = \cos\left(\frac{s}{R_0}\right)$$

then:

$$SE(s) = f(s) \cdot \frac{1}{\cos\left(\frac{s}{R_0}\right)} \cdot \int_{-\Delta r}^{+\Delta r} g(r) \, dr$$

The derivation of the distorted intensity $E_r^v$ has shown the following proportionality for the function $f(s)$:

$$f(s) \propto \frac{1}{\frac{ds}{dx_w}}$$

Since $$\int_{-\Delta r}^{+\Delta r} g(r) \, dr$$

is independent of s, it follow that:

$$SE(s) \propto \frac{1}{\frac{ds}{dx_w} \cdot \cos\left(\frac{s}{R_0}\right)}$$

Considering the coupling of s and $x_r$, it follows that $$SE(x_r) \propto \frac{1}{\frac{dx_r}{dx_w}}$$

From the quotient $$\frac{dx_r}{dx_w}$$

the scanning energy can thus be set directly, with $x_r$ being the x-component of a field point on the arc shaped field 42 and $x_w$ being the x-component of a field point on the rectangular field 41.

From a given curve of scanning energy $SE(x_r)$ or $SE(s)$ in the plane of the reticle, the azimuthal imaging magnification $\beta_s$ can be calculated with these formulas.

$$SE(s) = c \cdot \frac{1}{\frac{ds}{dx_w} \cdot \cos\left(\frac{s}{R_0}\right)}$$

$$\frac{ds}{dx_w} = c \cdot \frac{1}{SE(s) \cdot \cos\left(\frac{s}{R_0}\right)}$$

-continued $$x_w = c' \cdot \int_0^s SE(s') \cdot \cos\left(\frac{s'}{R_0}\right) ds'$$

The constant c' is obtained from the boundary condition that the edge of the rectangular field 41 at $$x_w^{Max}$$

has to be imaged on the edge of the arc shaped field at $s^{max} = s_0$.

$s(x_w)$, and therefore the imaging magnification $\beta_s(x_w)$, is consequently known as a function of $x_w$:

$$\beta_s = \beta_s(x_w) = \frac{s(x_w)}{x_w}$$

The aforementioned equation for the azimuthal magnification $\beta_s$ is to be solved by way of example for constant scanning energy $SE(x_r)$ in the plane of the reticle.

For constant scanning energy $SE^0$ in the plane of the reticle, the azimuthal imaging magnification is derived as follows:

$$x_w = c' \cdot \int_0^s SE^0 \cdot \cos\left(\frac{s'}{R_0}\right) ds' = c'' \int_0^s \cos\left(\frac{s'}{R_0}\right) ds'$$

$$x_w = c'' \cdot \left[\sin\left(\frac{s'}{R_0}\right)\right]_0^s = c'' \cdot \sin\left(\frac{s}{R_0}\right)$$

$$s(x_w) = R_0 \cdot a\sin\left(\frac{x_w}{c''}\right)$$

and thus $$\beta_s(x_w) = R_0 \cdot \frac{a\sin\left(\frac{x_w}{c''}\right)}{x_w}$$

An illumination system will be considered below with:

Rectangular field 41 in a plane conjugated to the plane of the reticle:
−8.75 mm ≤ $x_w$ ≤ 8.75 mm
−0.5 mm ≤ $y_w$ ≤ 0.5 mm Arc shaped field 42 in the plane of the reticle:
−52.5 mm ≤ s ≤ 52.5 mm
−3.0 mm ≤ r ≤ 3.0 mm With the boundary condition $s(x_w = -8.75) = 52.5$ mm the constant c" is obtained as follows:

c"=954.983, and thus $$\beta_s = R_0 \cdot \frac{a\sin\left(\frac{x_w}{954.983}\right)}{x_w}$$

If the design of the field lens group generates this curve of the azimuthal imaging magnification, then a constant scanning energy is obtained in the plane of the reticle for the system defined above byway of example.

With variation of the azimuthal magnification $\beta_s$, it is necessary for use in lithographic systems to consider that the field lens group, in addition to field formation, also determines the imaging of the secondary light sources, or the aperture stop plane, into the entrance pupil of the projection objective. This as well as the geometric boundary conditions does not permit an arbitrarily large distortion correction.

In a further embodiment of the invention at least one of the field mirrors of the field lens group is shaped as an inclined aspheric mirror. This allows the design of the field mirrors, which control the uniformity of the scan energy as well as the telecentricity in the object plane and the illumination of the exit pupil of the illumination system. Especially the imaging of the secondary light sources to the exit pupil of the illumination system and especially the problem of σ-variations can be improved by the present embodiment, which will be described in detail based on the following example of an inventive illumination system.

Figure 13:
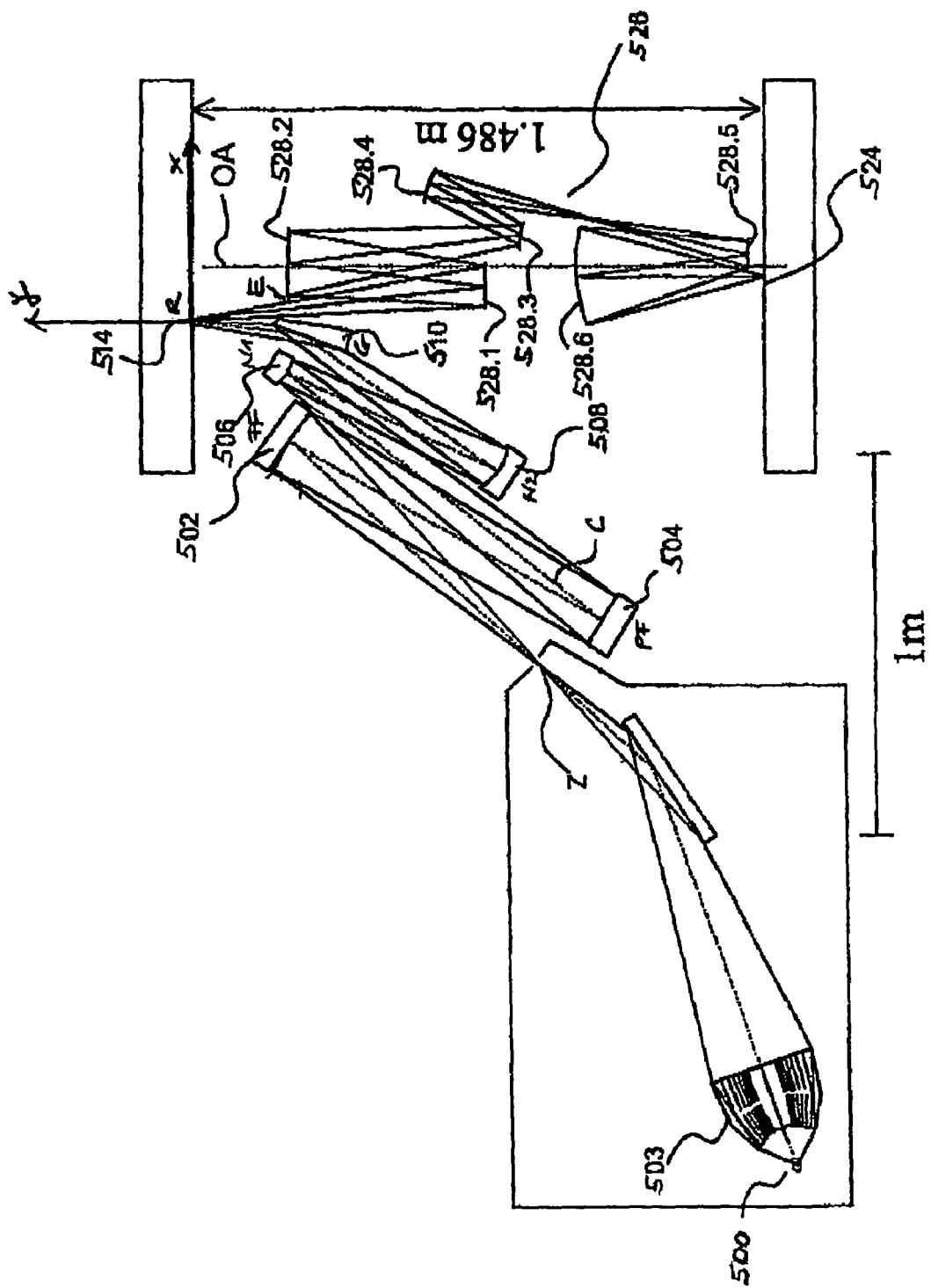
FIG. 13 is an embodiment of an illumination system.

The illumination system as shown in FIG. 13 comprises a nested collector 503 with eight cups. The first optical element 502 comprises 122 first raster elements with an extension of 54 mm×2.75 mm each. Each raster element produces a secondary light source. The second optical element 504 comprises at least 122 second raster elements which are associated with the first raster elements having a diameter of 10 mm each and being located in the vicinity of the secondary light sources. The second raster elements of the second optical element 504 are projected through the mirrors 506, 508 and 510, which form the field lens group, into the entrance pupil E of the downstream projection lens 526. The projection lens 526 comprises six mirrors 528.1, 528.2, 528.3, 528.4, 528.5, 528.6. According to the present embodiment of the invention, at least one of the field mirrors of the field lens group (506, 508 and 510) is shaped as an inclined aspheric mirror. The projection lens 526 projects the ring field in the object plane 514 into an image field in an image plane 524 in which the object to be illuminated is situated. The structure-bearing mask is arranged in the object plane 514.

The system as shown in FIG. 13 is designed for a field radius of R=130 mm at an illumination aperture of NA=0.03125 in the object plane 514, i.e. on the reticle, according to a filling ratio of σ=0.5 in the entrance pupil E of a downstream 4:1 projection lens with an aperture of NA=0.25 in the image plane 524 of the object to be illuminated.

As stated above, since at least one of the field mirrors of the field lens group, preferably field mirror 510, is shaped as an inclined aspheric mirror, it is possible to fulfill requirements being at cross-purposes, namely a highly uniform scan energy of the illuminated field in the object plane 514, a high telecentricity in the image plane 524 and a preferred illumination of the exit pupil of the illumination system, which coincidences with the entrance pupil E of the downstream projection lens 526.

The uniformity requirement has been explained in detail in the foregoing. The telecentricity requirements shall be understood as being the requirements placed on the principal ray of the illumination at each field point in the illuminated region of the field plane 514. The principal ray is the energetic mean over all illumination beams, which pass through a field point. Generally, a telecentric beam path in the plane of the substrate to be illuminated is desirable for projection lithography, i.e. in the image plane 524, so that no distortion errors are obtained in the defocusing of the substrate to be illuminated. This means that in the image plane the principal rays of a light bundle, which penetrate an image point should extend substantially parallel to the optical axis, with the deviation being less than 10 mrad for example.

To ensure that the principal rays extend in a telecentric fashion in the image plane 524 they must be set in the object plane 514 to respective angles which can be found easily by reverse beam tracing of the beam bundles through the projection lens 526. A specific progress of the angles of the principal rays in the field plane 514 is thus obtained which must be produced by the illumination system.

The imaging of the secondary light sources in the entrance pupil E of the projection lens 526, which coincides with the exit pupil of the illumination system, must be corrected very well. In particular, coma errors must not occur. If the imaging scale would not be constant over the angle of radiation, i.e. the pupil would appear differently large for different field points in the field to be illuminated. This would correspond to a σ-variation. A σ-variation is a variation of the divergence angle of the illumination beams on the reticle over the field, with a usually stating in the case of conventional circular illumination the ratio from the sine of the maximum angle $\partial_{bel}$ of the illumination beams with respect to the optical axis and the sine of the maximum acceptance angle An of the projection lens 526. The maximum aperture angle of the projection lens 526 can also be described by the input-side numerical aperture of the projection lens $NA_{EIN}=\sin \partial_{in}$. The sine of the maximum angle of the illumination beams concerning the optical axis is described by the numerical aperture $NA_{bel}=\sin \partial_{bel}$, so that the following applies: $\sigma=NA_{bel}/NA_{EIN}$. For EUV systems it typically applies that σ=0.5–0.8, with the σ-value being changeable by a variable or exchangeable diaphragm for example and with a σ-variation over the field of over 10% for example. In order to obtain increasingly smaller structure widths at low variation of the structure widths over the image field it is necessary that the σ-variation is substantially lower, e.g. less than 2%.

It has to be noted that for state of the art systems the homogeneity in the field plane to be illuminated is impaired with a sine-corrected field lens or field mirror system because such a sine-corrected field group will lead to a homogeneous field illumination only with Lambert's reflection characteristics of the secondary light source. Although it is possible in the case of any other reflection characteristics to control the homogeneity of the illumination in a plane by means of a purposeful deviation from the sine correction and thus to optimize the same, as is disclosed for example by DE 10138 313 A1 or the U.S. application Ser. No. 10/216,547, as filed with the U.S. Patent and Trademark Office on 9 Aug. 2002, the scope of disclosure of which is hereby fully included in the present application. This homogenization of the illumination generally leads to the σ-variation over the field as described above.

The condition that a homogenized illumination occurs in a condenser lens system only in connection with a Lambert radiator applies in the strict sense only by neglecting reflection and transmission losses. In reality, the ideally desired reflection characteristics of the first optical element 502 can be numerically calculated by reverse beam tracing from the image plane 524. Such numerical calculations are within the field of the expert knowledge of a person skilled in the art.

If the field forming for a ring field occurs through an optical component with an anamorphic field mirror (e.g. a field-forming grazing-incidence mirror 510 as described in the embodiment in connection with FIG. 13), it is necessary to ensure that there is no breach of the sine condition at least in the radial direction. In the azimuthal direction it is necessary to ensure that (for a field point) the conjugated pupil points all rotate by the same angle, i.e. the pupil must rotate evenly during the condenser imaging, thus avoiding any unevenness in the illumination of the pupil. This is shown in the illustrations FIG. 14A to 14B. The pupil is illuminated by the superposition of sub-pupils, e.g. 405, 415, 425, each of which is an image of an individual second raster element of the second optical element 504. For each field point, e.g. 401 or 411, respectively, in the illuminated field 400 a different pupil illumination exits. For FIG. 14A and FIG. 14B it is supposed for the sake of simplicity that the field dependence of the illumination of the exit pupil is limited to a rotation of the pattern of sub-pupils. This would mean that the chief rays 403 and 413 are identical and also the maximum angle of the light bundle originating from a given point in the illuminated field 400. Comparing the FIGS. 14A and 14B this can be seen if one regards sub-pupil 425, which moves its position in the exit pupil if the location in the illuminated field 400 is changed from field point 401 to field point 411.

Figure 14A:
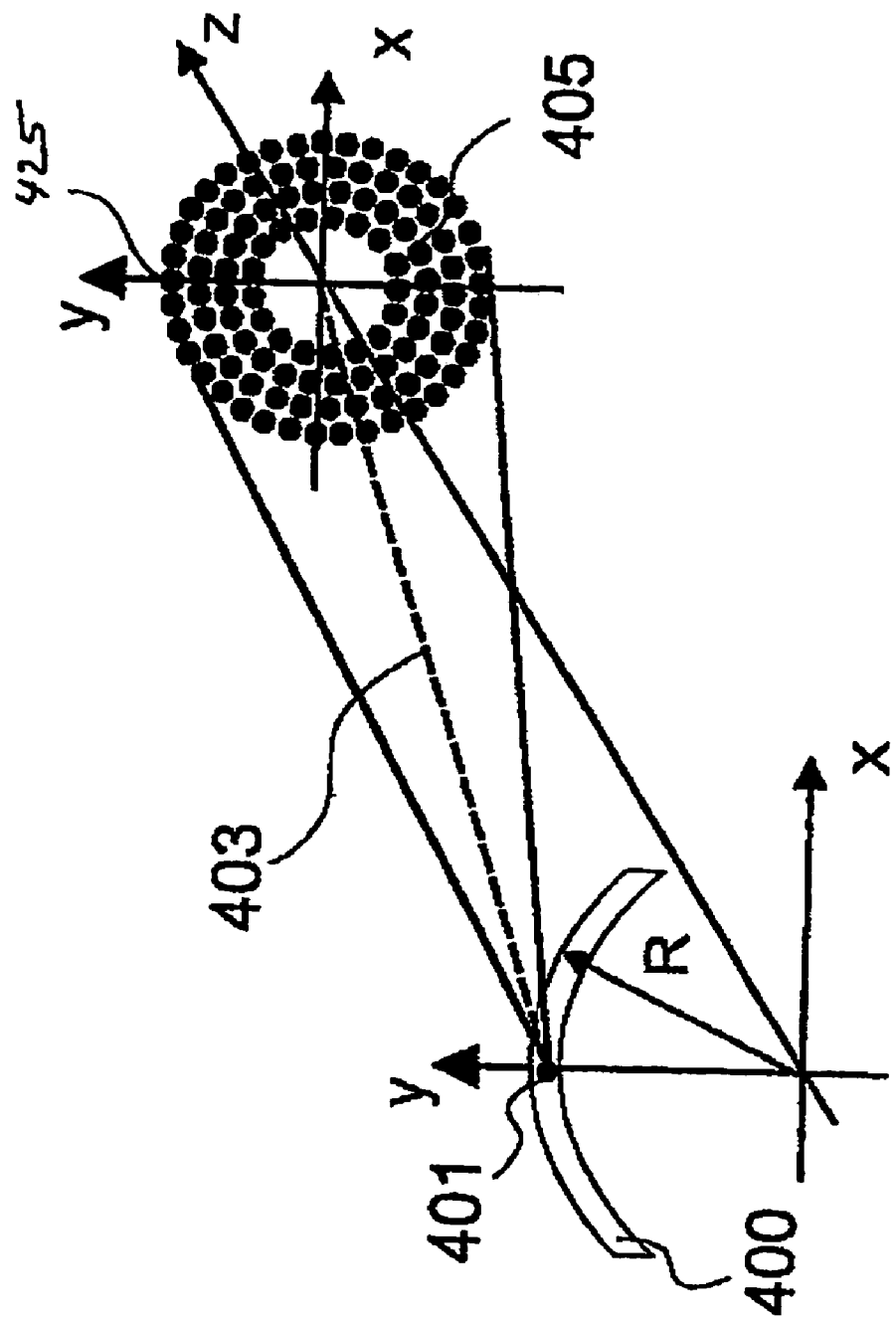
FIG. 14A illustrates the illumination of an exit pupil of the illumination system assigned to the central field point.
Figure 14B:
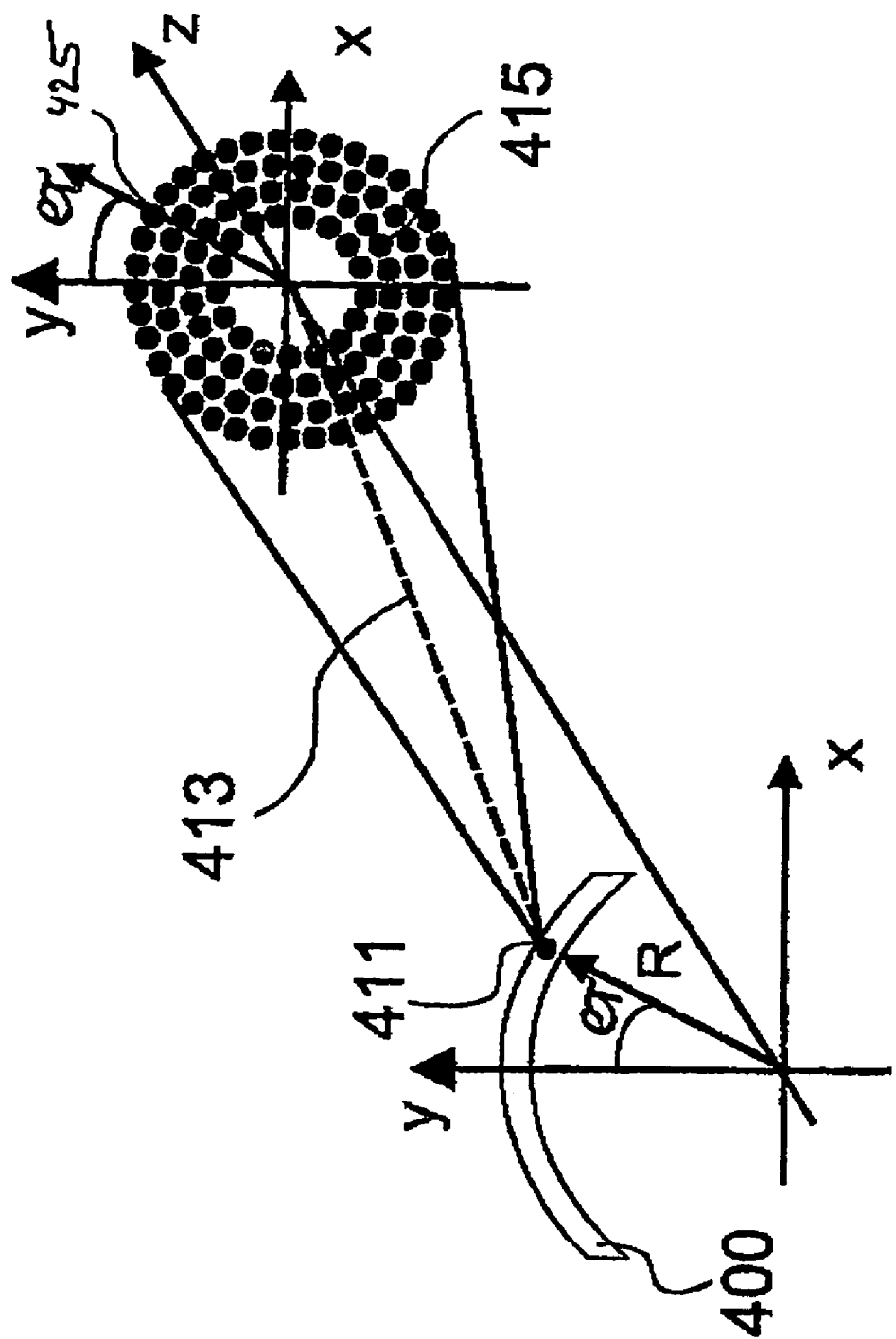
FIG. 14B illustrates the illumination of an exit pupil of the illumination system assigned to the field point having a certain distance for the center of the field.
Figure 14C:
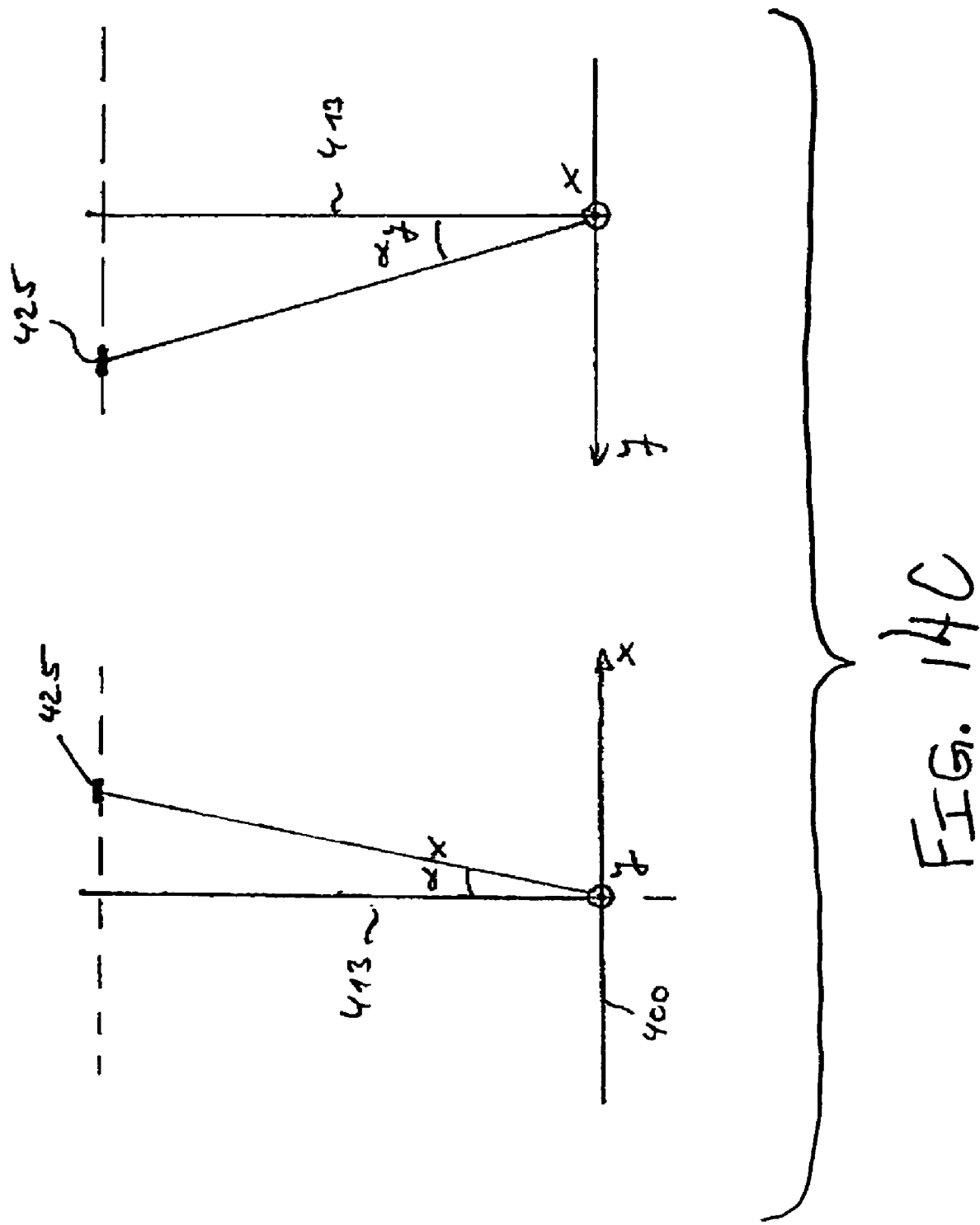
FIG. 14C illustrates projections in the x- and y-direction.

To determine σ-variations it is necessary to know the dependence of the positions of the sub-pupils in the exit pupils, and more specifically the field dependence for those sub-pupils, which define the circumference of the illuminated exit pupil such as the sub-pupil 425 in FIGS. 14A and 14B. The position of the sub-pupils in the exit pupil assigned to different field locations can be described in a specific angular coordinate system in the following called angular space. For the angular space the sub-pupil positions are given with respect to $\sin \alpha_x$ and $\sin a_y$, whereby the angles $\alpha_x$ and $\alpha_y$ are measured between the principal ray of a light bundle 403, 413 originating from a specific field point and the connecting line between the field point and the center of gravity of a given sub-pupil in the exit pupil with respect to the x- and y-direction of the Cartesian coordinate system of the field plane. The projections in the x- and y-direction is illustrated in FIG. 14C for sub-pupil 425 and its position in the exit pupil for an illuminating light bundle originating from field point 411 as shown in FIG. 14B.

Figure 15:
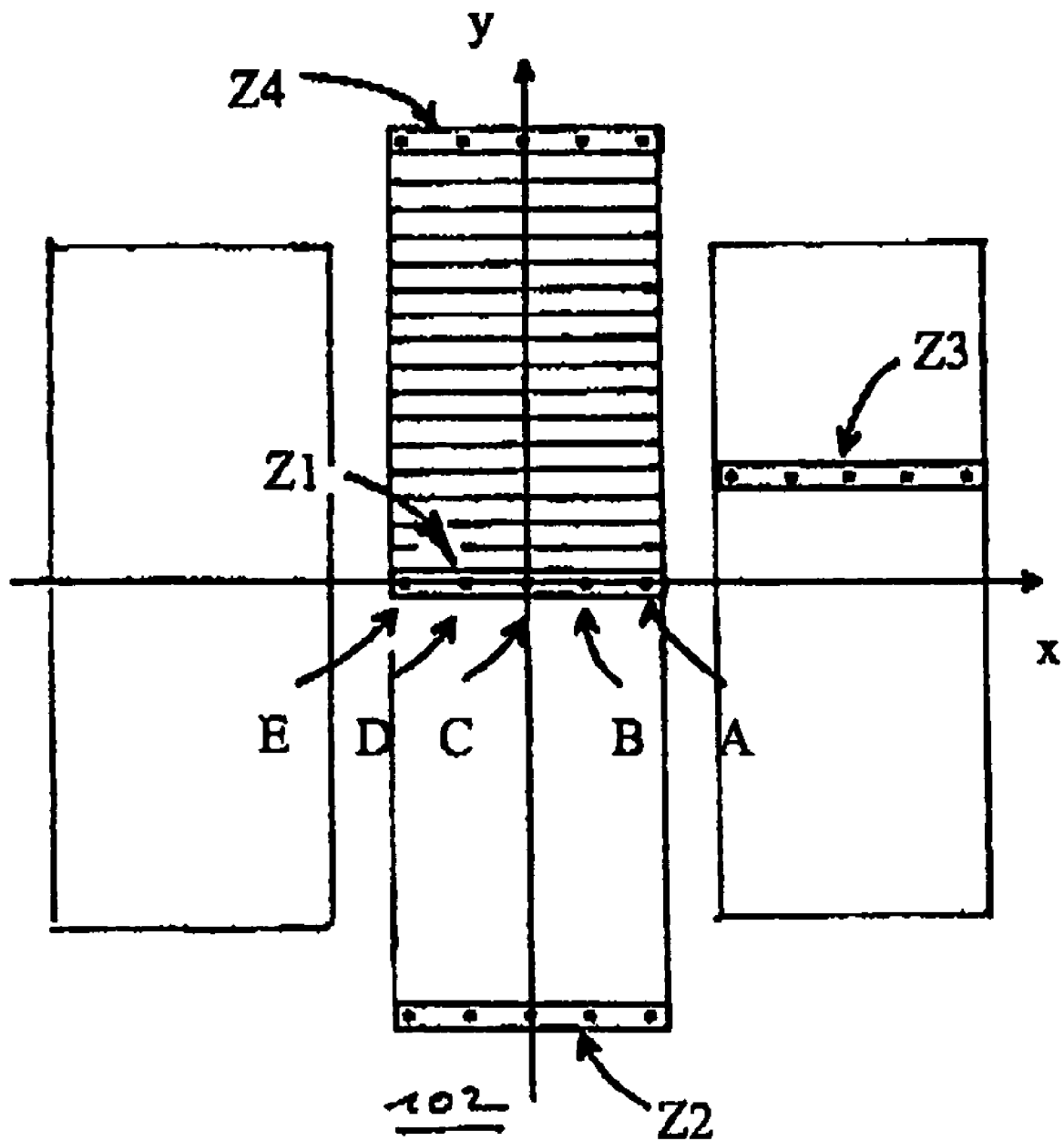
FIG. 15 shows 4 exemplary first raster elements on a first optical element.

So far only an ideal case has been described, which can only approximately be achieved for a real system. To explain this in more detail reference is made to FIG. 15, showing a selection of four representative first raster elements Z1, Z2, Z3 and Z4 from the first optical element 502. Each first raster element produces a secondary light source. In the vicinity thereof second raster elements of the second optical element 504 are arranged.

Figure 16:
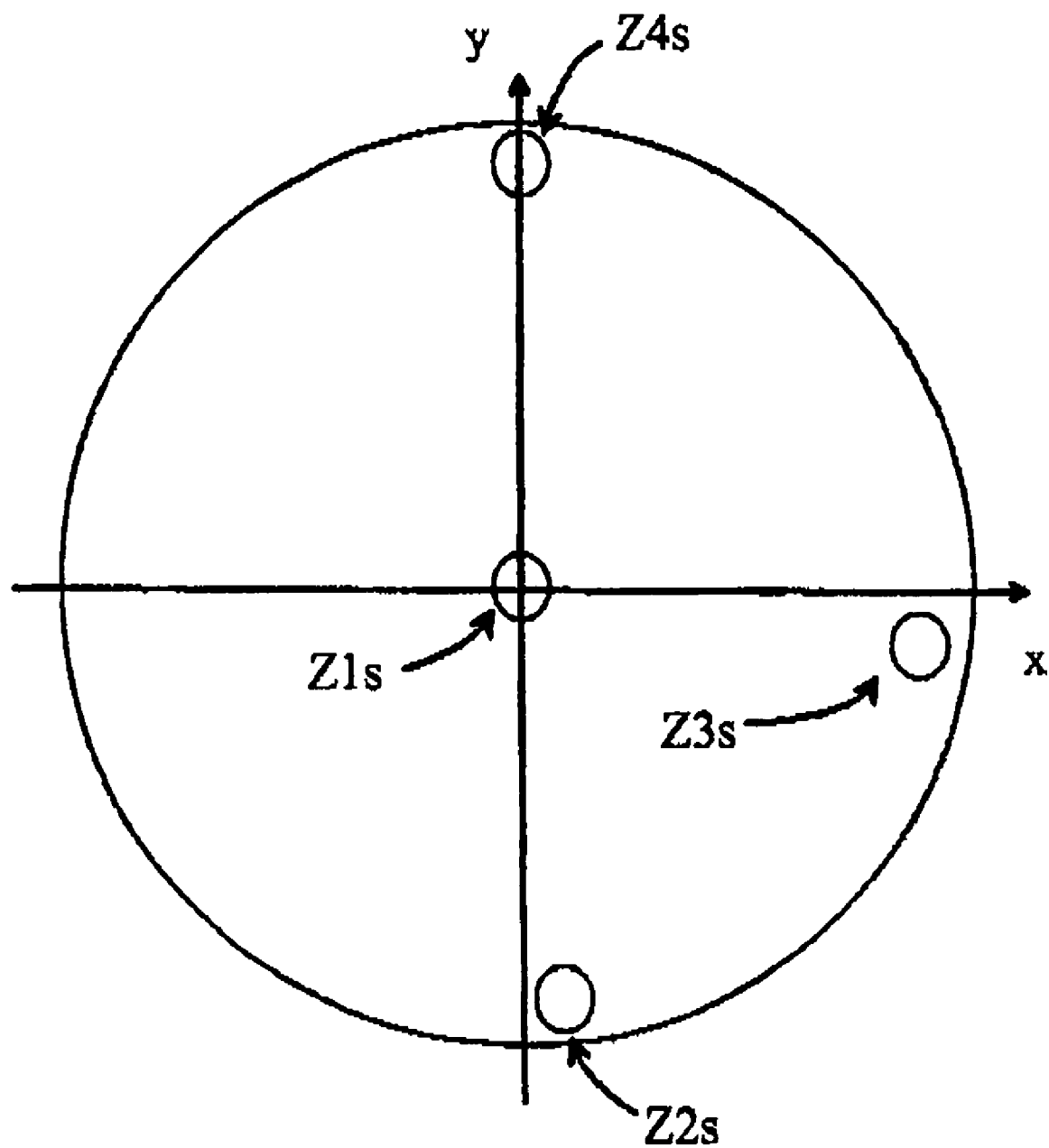
FIG. 16 shows 4 second raster elements on a second optical element, which are assigned to the selected first raster elements of FIG. 15.
Figure 17:
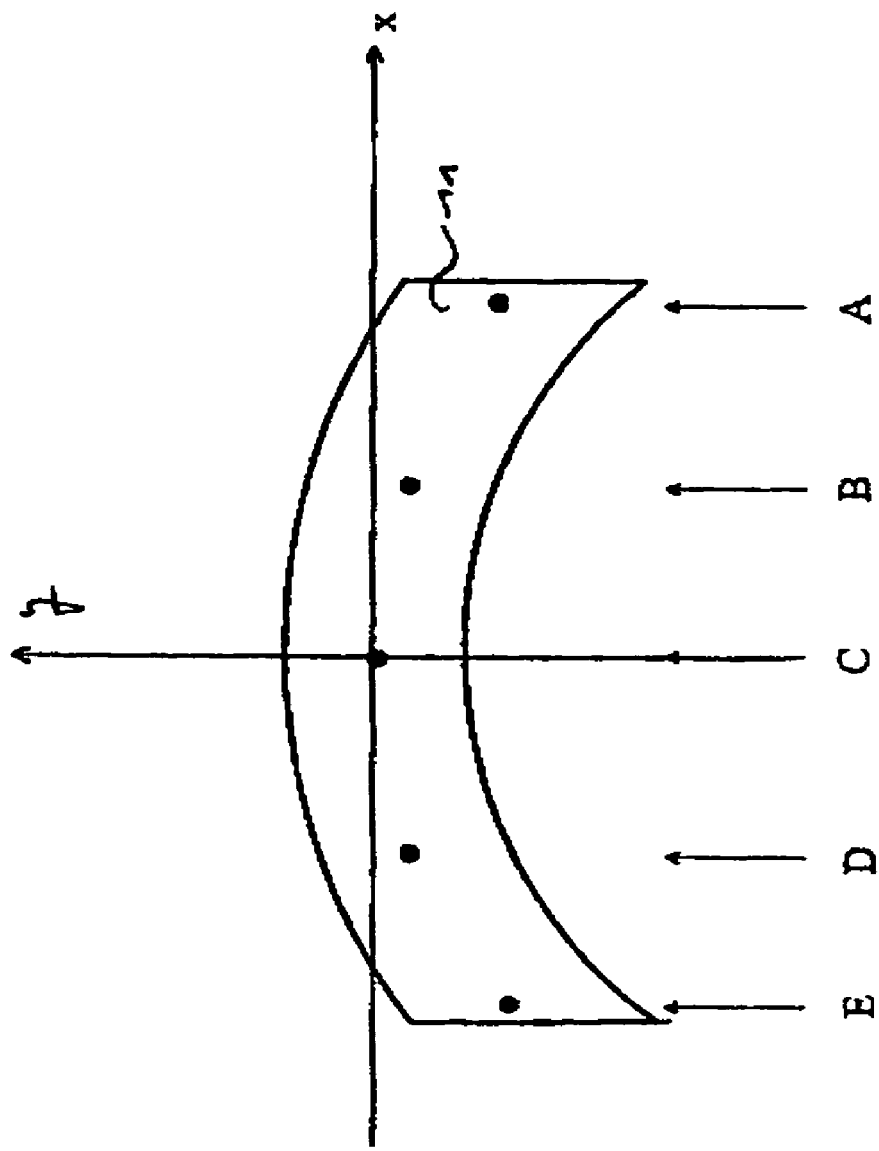
FIG. 17 shows an illuminated field with exemplary field points.

In FIG. 16 four of the second raster elements Z1s, Z2s, Z3s and Z4s are depicted which are assigned to the above-selected first raster elements Z1, Z2, Z3 and Z4 according to FIG. 15, e.g. second raster element Z1s corresponds to first raster element Z1 since it receives light from it and so forth. The superposition of each of the first raster elements via the field lens group leads to the illuminated ring field in the object plane as shown in FIG. 17. Each of the field points A, B, C, D, E receives light form each of the individual first raster elements of the first optical element 502, which is illustrated in FIG. 15 with the letters indicating the corresponding points for instance on the first raster elements denoted by the reference numeral Z1.

Figure 18:
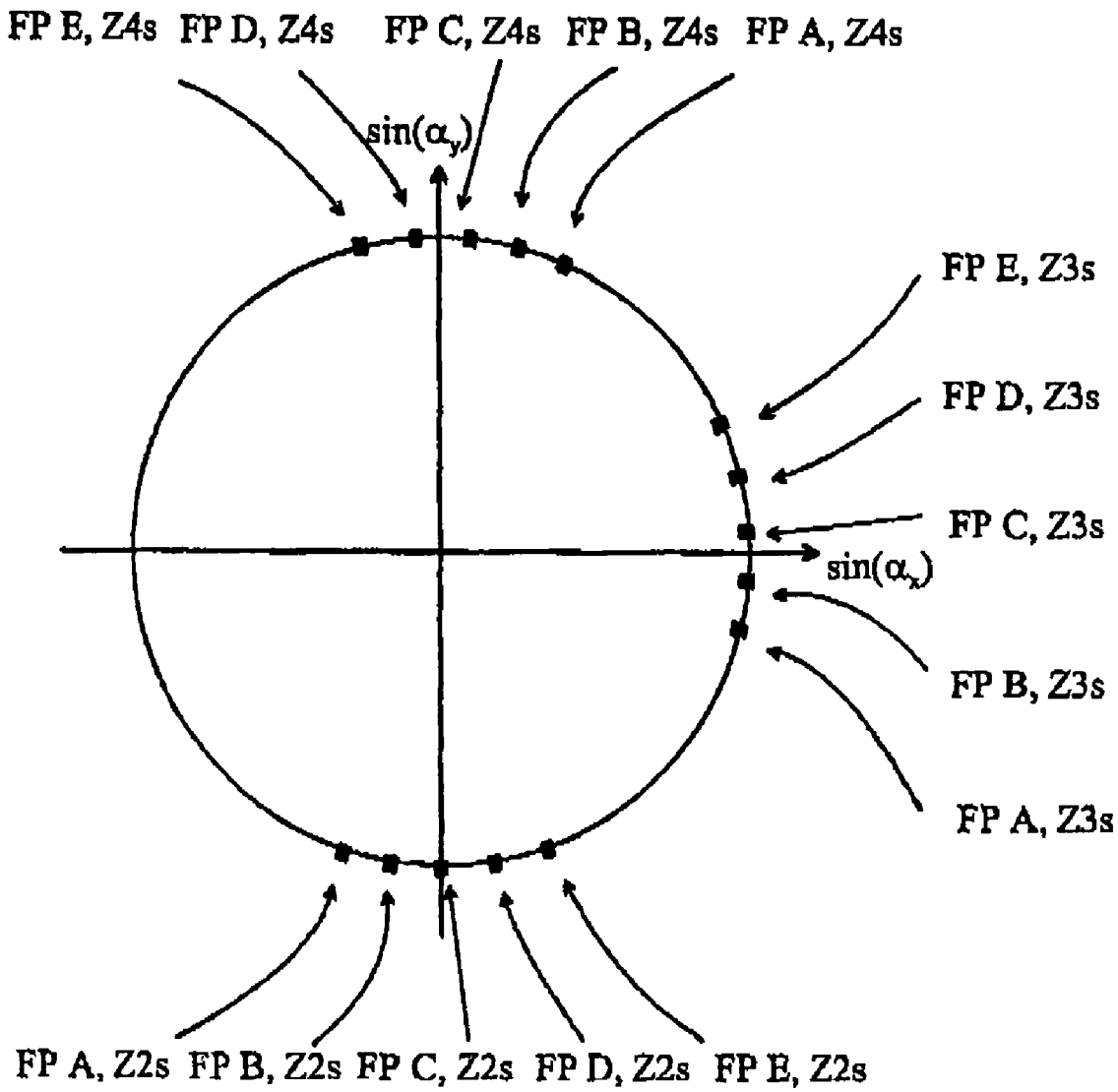
FIG. 18 shows nominal sub-pupil positions for the three different second raster elements and the exemplary field points as selected in FIG. 17.
Figure 19:
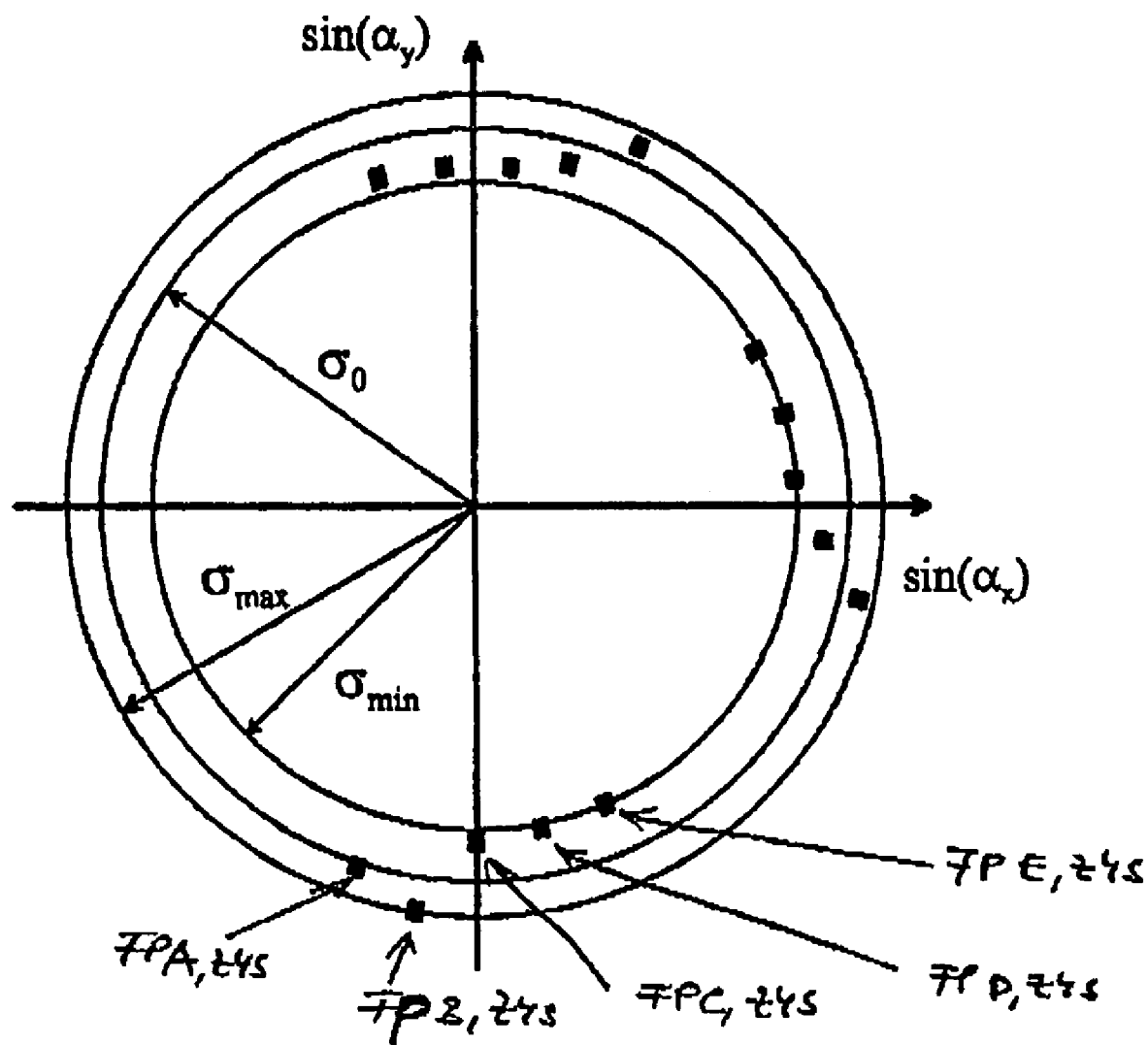
FIG. 19 shows the actual sub-pupil positions for the selected sub-pupils of FIG. 18 for a reference system with a hyperbolic field mirror.
Figure 20:
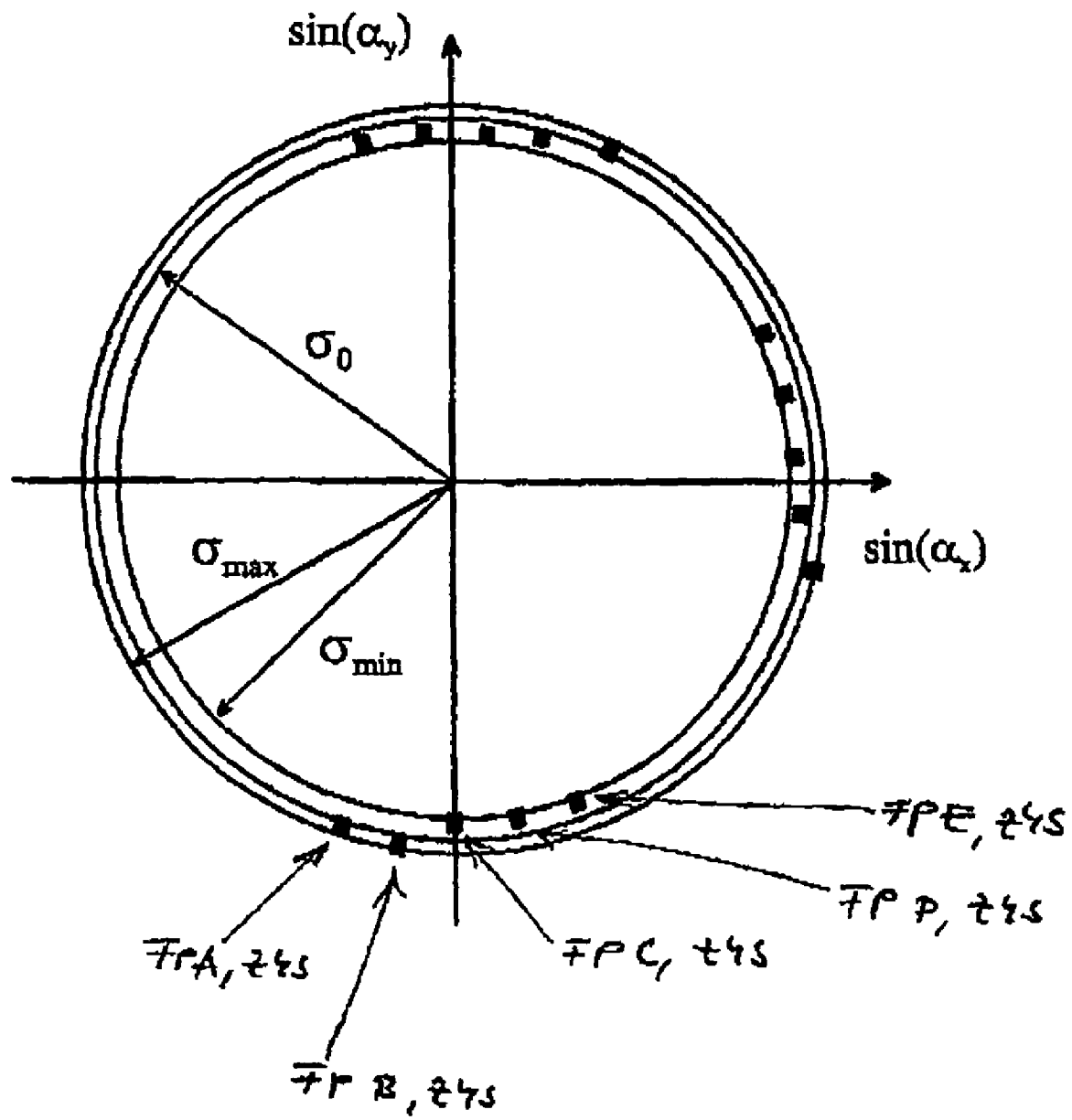
FIG. 20 shows the actual sub-pupil positions for the selected sub-pupils of FIG. 18 for an inventive system comprising a field mirror having an inclined aspheric shape.

For each of the field points a different illumination of the exit pupil of the illumination system can be assigned. If one regards the illumination of the exit pupil originating from a specific point in the illuminated field, it has to be noted that illumination consists of individual sub-pupils, which are images of the second raster elements. If the light bundle originating from a different field point is regarded, the sub-pupils in the exit pupil will change their positions. In the following the term sub-pupil position refers to the center of gravity of an image of a second raster element in the exit pupil. In order to have no σ-variations, the positional changes of the sub-pupils in the exit pupil upon a change in the field position have to follow predetermined nominal values. These nominal values are illustrated in FIG. 18 for three selected wandering sub-pupil positions assigned to the exemplary second raster elements Z2s, Z3s and Z4s of FIG. 16. What is shown in FIG. 18 are the ideal positions of the images of the second raster elements for the different field positions A, B, C, D and E as selected in FIG. 17, e.g. FP A, Z4s denotes a sub-pupil corresponding to the second raster element Z4s corresponding to location A on the ring field while FP B, Z4s is the sub-pupil originating from the same second raster element but receiving light from a different location on the illuminated ring field. The way to represent the position of a sub-pupil corresponding to a given second raster element and a specific position in the field in FIG. 18 and the subsequent FIGS. 19 and 20 is given in the angular space as defined above.

In FIG. 18 the ideal case is depicted, showing that all the sub-pupils move along a circle, which means that no σ-variation will occur. As stated above, the effort to minimize the σ-variation is at cross-purposes with the requirement to achieve a highly uniform field. However if the ideal positions of the sub-pupils have to be relaxed due to uniformity requirements, the result will be unwanted σ-variations and increased telecentricity errors. However, by using an inclined aspheric surface for at least one of the mirrors of the field lens group according to the invention these contradicting requirements can be addressed in an improved way.

An inclined aspheric surface can be described by the following general formula $$K_{xy}(x, y) = \frac{R_x x^2 + R_y y^2}{1 + \sqrt{1 - (1 + k_x)(R_x x)^2 - (1 + k_y)(R_y y)^2}} +$$
$$c_1 x + c_2 y + c_3 x^2 + c_4 xy + c_5 y^2 + c_6 x^3 + c_7 x^2 y + \ldots$$

whereby the function $K_{xy}$ is given with respect to Cartesian coordinates x and y. As parameters the conic constants $K_x$ and $K_y$, the radii of curvature $R_x$ and $R_y$ and $c_i$ as coefficients of the power series representing the aspheric component are used.

The shape of an inclined aspheric mirror surface can be divided in a toric component and an aspheric component. While the toric component is represented by the first term of the aforementioned general formula for an inclined aspheric body, the aspheric component is described by the second term of said formula.

In the following an e embodiment of the inventive system having an inclined aspheric surface for mirror 510 in the field lens group is compared to an example for a state of the art system. The data for both systems are given in the table 1 for the reference system according to the state of the art and in table 2 for the inventive system having a field mirror with an inclined aspheric shape. Positions of the optical components are given in the tables 1 and 2 by a sequence of translations in x-direction, in y-direction and in z-direction noted with respect to a Cartesian xy-coordinate system having its origin in the center of the illuminated ring field in the object plane as shown in FIG. 13. The orientations of the optical components are given by a sequence of rotations about the local x-axis (α), the local y-axis (β) and the local z-axis (γ) with the angles given in tables 1 and 2, respectively. With the positions and orientations, which are given in tables 1 and 2, a local Cartesian coordinate system is defined for each optical component. The abbreviations for the optical components are as following: FF is the first optical element 502 with first raster elements Z1, Z2, Z3 and Z4, PF is the second optical element 504 with second raster elements Z1s, Z2s, Z3s and Z4s, N1 and N2 are the normal incidence mirrors 506 and 508 of the field lens group, G is the grazing incidence mirror 510 of the field lens group and R the reticle in the object plane. The parameters $R_x$ and $R_y$ are the radii of curvature, $K_x$ and $K_y$ are conic constants, where the x-direction and the y-direction are given by the local Cartesian coordinate system of each optical component, and $c_i$ are the coefficients of the power series representing the aspheric component for the inventive embodiment of table 2.

The reference system of table 1 employs a hyperbolic G-mirror, while the G-mirror of the inventive system (table 2) is an inclined aspheric surface, whereby the origin of the aspheric component is the point of impingement of the center ray C on the G-mirror—see FIG. 13.

TABLE 1

State of the art system

| | mirror data | | | | position | | | orientation | | |
|---|---|---|---|---|---|---|---|---|---|---|
| | $R_x$[mm] | $R_y$[mm] | $k_x$ | $k_y$ | X[mm] | Y[mm] | Z[mm] | α[°] | β[°] | γ[°] |
| 2nd light source | — | — | — | — | 0.000 | 917.192 | −838.987 | 44.819 | 0.000 | 0.000 |
| FF-mirror | — | — | — | — | 0.000 | 296.540 | −214.403 | 38.669 | 0.000 | 0.000 |
| Z1 | −904.169 | −904.169 | x | x | 0.000 | 296.540 | −214.403 | 38.669 | 0.000 | 0.000 |
| Z2 | −904.169 | −904.169 | x | x | 0.000 | 230.741 | −267.059 | 41.763 | 0.000 | 0.000 |
| Z3 | −904.169 | −904.169 | x | x | 54.500 | 308.349 | −204.952 | 37.855 | 1.393 | 0.000 |
| Z4 | −904.169 | −904.169 | x | x | 0.000 | 362.339 | −161.746 | 35.259 | −0.175 | 0.000 |
| PF-mirror | — | — | — | — | 0.000 | 802.000 | −1007.233 | 216.919 | 0.000 | 0.000 |
| Z1s | −1090.203 | −1090.203 | x | x | 0.000 | 802.000 | −1007.233 | 216.919 | 0.000 | 0.000 |
| Z2s | −1090.203 | −1090.203 | x | x | 0.000 | 745.392 | −1049.765 | 215.747 | 0.000 | 0.000 |

TABLE 1-continued

State of the art system

| | mirror data | | | | position | | | orientation | | |
|---|---|---|---|---|---|---|---|---|---|---|
| | $R_x$[mm] | $R_y$[mm] | $k_x$ | $k_y$ | X[mm] | Y[mm] | Z[mm] | α[°] | β[°] | γ[°] |
| Z3s | −1090.203 | −1090.203 | x | x | 67.274 | 805.657 | −1004.485 | 216.695 | 1.879 | 0.000 |
| Z4s | −1090.203 | −1090.203 | x | x | 5.744 | 851.626 | −969.947 | 217.607 | 0.303 | 0.000 |
| N1 | 283.300 | 283.300 | x | x | 0.000 | 115.338 | −226.147 | 32.547 | 0.000 | 0.000 |
| N2 | −855.117 | −855.117 | x | x | 0.000 | 359.755 | −781.020 | 209.003 | 0.000 | 0.000 |
| point of impingement on G | — | — | — | — | 0.000 | 31.359 | −298.357 | 110.131 | 0.000 | 0.000 |
| G | −77.126 | −77.126 | — | −1.14792 | 0.000 | −220.395 | 113.959 | −5.046 | 0.000 | 0.000 |
| R | — | — | — | — | 0.000 | 0.000 | 0.000 | 0.000 | 0.000 | 0.000 |

TABLE 2

Inventive System with an inclined aspheric surface in the field lens group

| | mirror data | | | | position | | | orientation | | |
|---|---|---|---|---|---|---|---|---|---|---|
| | $R_x$[mm] | $R_y$[mm] | $k_x$ | $k_y$ | X[mm] | Y[mm] | Z[mm] | α[°] | β[°] | γ[°] |
| 2nd light source | — | — | — | — | 0.000 | 913.026 | −845.667 | 44.300 | 0.000 | 0.000 |
| FF-mirror | — | — | — | — | 0.000 | 298.057 | −215.485 | 38.150 | 0.000 | 0.000 |
| Z1 | −904.169 | −904.169 | x | x | 0.000 | 298.057 | −215.485 | 38.150 | 0.000 | 0.000 |
| Z2 | −904.169 | −904.169 | x | x | 0.000 | 231.784 | −267.544 | 41.244 | 0.000 | 0.000 |
| Z3 | −904.169 | −904.169 | x | x | 54.500 | 309.952 | −206.142 | 37.336 | 1.393 | 0.000 |
| Z4 | −904.169 | −904.169 | x | x | 0.000 | 364.331 | −163.426 | 34.740 | −0.175 | 0.000 |
| PF-mirror | — | — | — | — | 0.000 | 796.314 | −1012.862 | 216.400 | 0.000 | 0.000 |
| Z1s | −1090.203 | −1090.203 | x | x | 0.000 | 796.314 | −1012.862 | 216.400 | 0.000 | 0.000 |
| Z2s | −1090.203 | −1090.203 | x | x | 0.000 | 739.323 | −1054.879 | 215.228 | 0.000 | 0.000 |
| Z3s | −1090.203 | −1090.203 | x | x | 67.274 | 799.996 | −1010.148 | 216.176 | 1.879 | 0.000 |
| Z4s | −1090.203 | −1090.203 | x | x | 5.744 | 846.276 | −976.027 | 217.088 | 0.303 | 0.000 |
| N1 | 280.081 | 280.081 | x | x | 0.000 | 116.756 | −225.587 | 32.200 | 0.000 | 0.000 |
| N2 | −851.015 | −851.015 | x | x | 0.000 | 359.496 | −781.196 | 208.900 | 0.000 | 0.000 |
| G | 167.931 | 4076.557 | −0.1767 | 233.7663 | 0.000 | 31.359 | −298.357 | 110.100 | 0.000 | 0.000 |
| R | — | — | — | — | 0.000 | 0.000 | 0.000 | 0.000 | 0.000 | 0.000 |

| | |
|---|---|
| C1 | 0 |
| C2 | 0 |
| C3 | −0.001348515 |
| C4 | 0 |
| C5 | −2.1071E−05 |
| C6 | 0 |
| C7 | 2.22079E−06 |
| C8 | 0 |
| C9 | 1.04859E−07 |
| C10 | −2.10387E−08 |
| C11 | 0 |
| C12 | −9.91479E−09 |
| C13 | 0 |
| C14 | −1.30643E−09 |
| C15 | 0 |
| C16 | 7.15748E−12 |
| C17 | 0 |
| C18 | −8.00547E−15 |
| C19 | 0 |
| C20 | 8.35761E−16 |
| C21 | 0 |
| C22 | 2.01289E−15 |
| C23 | 0 |
| C24 | −2.69123E−17 |
| C25 | 0 |
| C26 | 2.01289E−15 |
| C27 | 0 |
| C28 | −2.69123E−17 |
| C29 | 0 |
| C30 | −3.211E−18 |

In FIG. 18 ideal positions for exemplary sub-pupils depicted in the angular space are shown. Consequently the assigned field points can vice versa regarded as the nominal or ideal positions A, B, C, D, E. For the real systems of tables 1 and 2 the occurring deviations can be described in the first place as deviations from the ideal field positions (A, B, C, D, E) in the field plane. For rays impinging on different second raster elements (Z1s, Z2s, Z3s, Z4s) these deviations are given table 3 for the reference system with the system data of table 1 and table 4 for the inventive system having a field mirror with an inclined aspheric shape, where Δx indicates a deviation in x-direction and Δy indicates a deviation in y-direction according to the local coordinate system in the field plane. The resulting deviations from the ideal positions of the sub-pupils in the exit pupil of the illumination system are given in table 3 and table 4 for the reference case and the inventive embodiment respectively as a deviation in the angular space as well, where the resulting angles are calculated with respect to the local coordinate system of the illuminated ring field in the object plane as shown in FIG. 13. The angular deviations in table 3 and table 4 are described for rays at the field points (A, B, C, D, E) coming from the second raster elements (Z1s, Z2s, Z3s, Z4s) by a deviation $\Delta\alpha_x$ and a deviation $\Delta\alpha_y$.

The reference system has an angular deviation of 1.7 mrad, while the inventive system has only 0.37 mrad as angular deviation in the field plane. This, combined with the fact that the positional deviations are comparable in both cases, result in that the inventive system features a reduced σ-variation, which can be seen from the comparison of FIG. 19, showing the σ-variation for representative sub-pupils which correspond to those of FIG. 18 for the reference system, and FIG. 20 showing the inventive system having an inclined aspheric G-mirror in the field lens group.

TABLE 3

Deviations of position and direction for the reference system

| sub-pupil | field point | $\Delta\alpha_x$[mrad] | $\Delta\alpha_y$[mrad] | Δx[mm]] | Δy[mm] |
|---|---|---|---|---|---|
| Z1s | A | 0.207 | 0.633 | −0.317 | −0.249 |
|  | B | 0.212 | −0.136 | −0.308 | 0.133 |
|  | C | 0.000 | −0.389 | 0.000 | 0.208 |
|  | D | −0.212 | −0.136 | 0.308 | 0.133 |
|  | E | −0.207 | 0.633 | 0.317 | −0.249 |
| Z2s | A | −0.492 | 1.679 | −0.542 | 0.284 |
|  | B | 0.070 | −0.176 | −0.621 | −0.211 |
|  | C | 0.000 | −0.807 | 0.000 | −0.474 |
|  | D | −0.070 | −0.176 | 0.621 | −0.211 |
|  | E | 0.492 | 1.679 | 0.542 | 0.284 |
| Z3s | A | −0.920 | 0.562 | −0.244 | −0.238 |
|  | B | 0.024 | −0.079 | −0.631 | 0.263 |
|  | C | 0.265 | −0.490 | −0.543 | 0.251 |
|  | D | −0.039 | −0.446 | −0.176 | 0.031 |
|  | E | −0.652 | 0.298 | 0.152 | −0.377 |
| Z4s | A | −0.474 | −0.760 | 0.066 | −0.630 |
|  | B | −0.291 | −0.440 | 0.038 | 0.385 |
|  | C | −0.005 | −0.333 | 0.054 | 0.700 |
|  | D | 0.234 | −0.477 | 0.086 | 0.399 |
|  | E | 0.285 | −0.795 | 0.096 | −0.582 |

TABLE 4

Deviations of position and direction for the inclined aspheric system

| sub-pupil | field point | $\Delta\alpha_x$[mrad] | $\Delta\alpha_y$[mrad] | Δx[mm]] | Δy[mm] |
|---|---|---|---|---|---|
| Z1s | A | 0.175 | 0.230 | −0.065 | −0.310 |
|  | B | 0.078 | 0.104 | −0.211 | −0.011 |
|  | C | 0.000 | 0.000 | 0.000 | 0.000 |
|  | D | −0.079 | 0.106 | 0.211 | −0.010 |
|  | E | −0.227 | 0.278 | 0.075 | −0.297 |
| Z2s | A | 0.149 | −0.013 | −0.582 | −0.113 |
|  | B | −0.266 | 0.164 | −0.555 | −0.426 |
|  | C | 0.000 | 0.098 | 0.000 | −0.666 |
|  | D | 0.269 | 0.163 | 0.554 | −0.427 |
|  | E | −0.157 | 0.078 | 0.583 | −0.089 |

TABLE 4-continued

Deviations of position and direction for the inclined aspheric system

| sub-pupil | field point | $\Delta\alpha_x$[mrad] | $\Delta\alpha_y$[mrad] | Δx[mm]] | Δy[mm] |
|---|---|---|---|---|---|
| Z3s | A | −0.188 | 0.080 | −0.189 | −0.166 |
|  | B | −0.259 | −0.287 | −0.599 | 0.112 |
|  | C | 0.249 | −0.131 | −0.674 | 0.058 |
|  | D | −0.059 | 0.060 | −0.361 | −0.118 |
|  | E | −0.329 | 0.332 | −0.240 | −0.469 |
| Z4s | A | −0.368 | 0.014 | 0.367 | −0.435 |
|  | B | −0.361 | −0.341 | 0.165 | 0.262 |
|  | C | −0.010 | 0.196 | 0.046 | 0.592 |
|  | D | 0.276 | −0.324 | −0.051 | 0.278 |
|  | E | 0.164 | −0.106 | −0.210 | −0.421 |

The teachings of the embodiment of a field lens group with one field mirror having an inclined aspheric shape can also be applied to more the one inclined aspheric element. The one or more aspheric elements of the field lens group can be field mirrors or field lenses. It is also possible to combine an inclined aspheric shape of a field mirror with actuators for actively controlling the mirror surface.

The previously described uniformity correction is not restricted to the illumination system with a faceted mirror described by way of example, but can be used in general. By distorting the image formation in the reticle plane perpendicular to the scanning direction the intensity distribution, and thus the scanning energy distribution, can be controlled.

Typically, the illumination system contains a real or virtual plane with secondary light sources. This is always the case, in particular, with Kohler illumination systems. The aforementioned real or virtual plane is imaged in the entrance pupil of the objective using the field lens group, with the arc shaped field being produced in the pupil plane of this image formation. The pupil plane of the pupil imaging is, in this case, the plane of the reticle.

Further examples of embodiment of illumination systems will having filed mirrors of an aspheric shape be described below, where the distribution of scanning energy is controlled by the design of the field lens group. The general layout of the illumination systems is shown in FIG. 2. The optical data of the illumination system are summarized in table 5.

TABLE 5

|  | Ref. No. in FIG. 2 | Surface parameters (Radius R, conical constant K) | Thickness d along the optical axis [mm] | Angle between surface normal and the optical axis $\alpha_x$ [°] |
|---|---|---|---|---|
| Source | 200 | ∞ | 100.000 | 0.0 |
| Collector mirror | 12 | R = −183.277 mm<br>K = −0.6935 | 881.119 | 0.0 |
| Mirror with field facets | 22 | ∞ | 200.000 | 7.3 |
| Aperture stop plane | 23 | ∞ | 1710.194 | 0.0 |
| 1st Field mirror | 24 | $R_y$ = −7347.291 mm<br>$R_x$ = −275.237<br>$K_y$ = −385.814<br>$K_x$ = −3.813 | 200.000 | 80.0 |
| 2nd Field mirror | 25 | $R_y$ = 14032.711<br>$R_x$ = 1067.988<br>$K_y$ = −25452.699<br>$K_x$ = −667.201 | 250.000 | 80.0 |

TABLE 5-continued

| Ref. No. in FIG. 2 | Surface parameters (Radius R, conical constant K) | Thickness d along the optical axis [mm] | Angle between surface normal and the optical axis $\alpha_x$ [°] |
|---|---|---|---|
| Reticle 26 | ∞ | 1927.420 | 2.97 |
| Exit pupil 27 | ∞ | | |

The illumination system of FIG. 2 and Table 5 is optimized for a Laser-Produced-Plasma source 200 at λ=13 nm with a source diameter of 50 μm. The solid angle Ω of the collected radiation is Ω≈2π.

The mirror 22 with field facets has a diameter of 70.0 mm, and the plane field facets have a rectangular shape with x-y dimensions of 17.5 mm×1.0 mm. The mirror 22 consists of 220 field facets. Each facet is tilted relative to the local x- and y-axis to overlay the images of the field facets at least partly in the image plane 26. The field facets at the edge of mirror 22 have the largest tilt angles in the order of 6°. The mirror 22 is tilted by the angle $\alpha_x$=7.3° to bend the optical axis by 14.6°.

The aperture stop plane 23 in this example is not accessible.

The first and second field mirrors 24 and 25 are grazing incidence mirrors. Each of them bends the optical axis by 160°. The field mirror 24 is a concave mirror, and the mirror 25 is a convex mirror. They are optimized to control the illumination intensity, the field shaping and the pupil imaging. In the following embodiments only these two mirrors will be replaced. Their position and tilt angle will always be the same. It will be shown, that by modifying the surface shape, it is possible to change the intensity distribution while keeping the pupil imaging and the field shaping in tolerance.

The arc shaped field in the plane of the reticle 26 can be described by
$R_0$=100.0 mm
$\Delta r$=6.0 mm; −3.0 mm≦r≦3.0 mm
$\alpha_0$=30°

The reticle 26 is tilted by $\alpha_x$=2.97° in respect to the optical axis. The position of the exit pupil 27 of the illumination system is defined by the given design of the projection objective.

A notable feature of the present invention is the asphericity of the mirror surfaces that provide a favorable uniformity of scanning energy on the one hand, and on the other hand a favorable telecentricity. While the asphericity of the mirror surfaces will be varied, the tilt angles and spacing of the mirrors are to be kept constant.

The following examples are presented and compared with reference to the following parameters:

$$\text{Uniformity [\%]} = 100\% \cdot \frac{SE_{\max} - SE_{\min}}{SE_{\max} + SE_{\min}}$$

$SE_{max}$: maximum scanning energy in the illuminated field.
$SE_{min}$: minimum scanning energy in the illuminated field.
maximum telecentricity error $\Delta i_{max}$ over the illuminated field in the reticle plane $\Delta i_{max} = [i_{act} - i_{ref}]$max in[mrad]

$i_{act}$: angle of a centroid ray with respect to the plane of the reticle at a field 10 point.
$i_{ref}$: angle of a chief ray of the projection objective with respect to the plane of the reticle at the same field point.

The maximum telecentricity error $\Delta i_{max}$ will be calculated for each field point in the illuminated field. The direction of the centroid ray is influenced by the source characteristics and the design of the illumination system. The direction of the chief ray of the projection objective in the plane of the reticle depends only on the design of the projection objective. Typically the chief rays hit the wafer plane telecentrically.

To get the telecentricity error in the wafer plane the telecentricity error in the reticle plane has to be divided by the magnification of the projection objective. Typically the projection objective is a reduction objective with a magnification of β=−0.25, and therefore the telecentricity error in the wafer plane is four times the telecentricity error in the reticle plane.

geometric parameters of the first field mirror: $R_x$, $R_y$, $K_x$, $K_y$
geometric parameters of the second field mirror: $R_x$, $R_y$, $K_x$, $K_y$ Both field mirrors are toroidal mirrors with surface parameters defined in the x- and y-direction. R describes the Radius, K the conical constant. It is also possible to vary higher aspherical constants, but in the examples shown below only the radii and conical constants will be varied.

1st Example of Embodiment:

For field mirrors with purely spherical x and y cross sections, the following characteristics are obtained:
Uniformity=10.7%
$\Delta i_{max}$=0.24 mrad
Field mirror 1: $R_x$=−290.18, $R_y$=−8391.89, $K_x$=0.0, $K_y$=0.0
Field mirror 2: $R_x$=−1494.60, $R_y$=−24635.09, $K_x$=0.0, $K_y$=0.0

Figure 5:
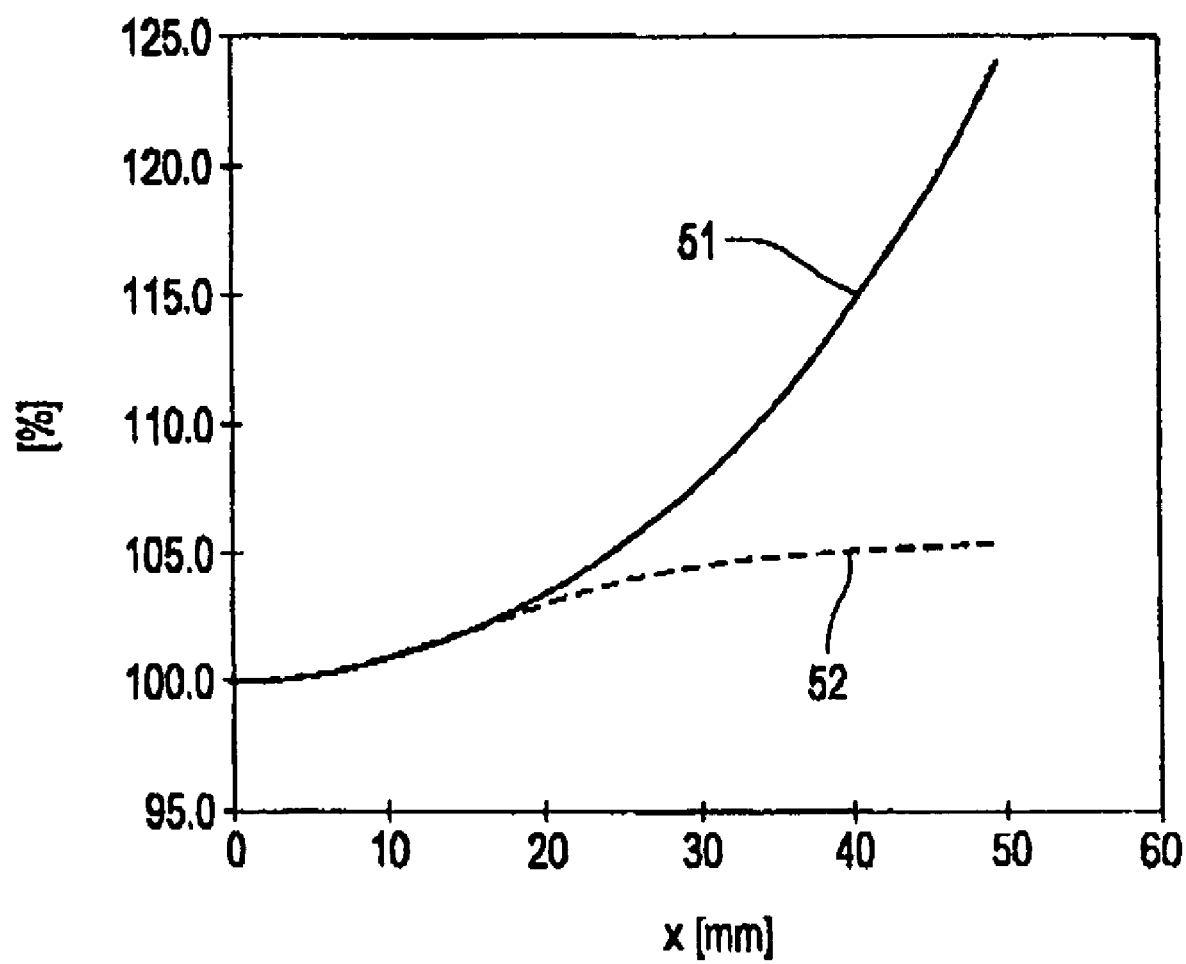
FIG. 5 is a graph of a calculated curve of an integral scanning energy in a plane of a reticle considering a central field facet in accordance with the present invention.

The curve of the scanning energy over the x direction in the plane of the reticle is plotted in FIG. 5 as a solid line 51. Because the system is symmetric to the y-axis, only the positive part of the curve is shown. The scanning energy is normalized at the center of the field at 100%. The scanning energy rises toward the edge of the field to 124%. The calculation takes into consideration only the imaging of one representative field facet, in this case the central field facet, which is assumed to be a homogenous radiating surface.

Figure 6:
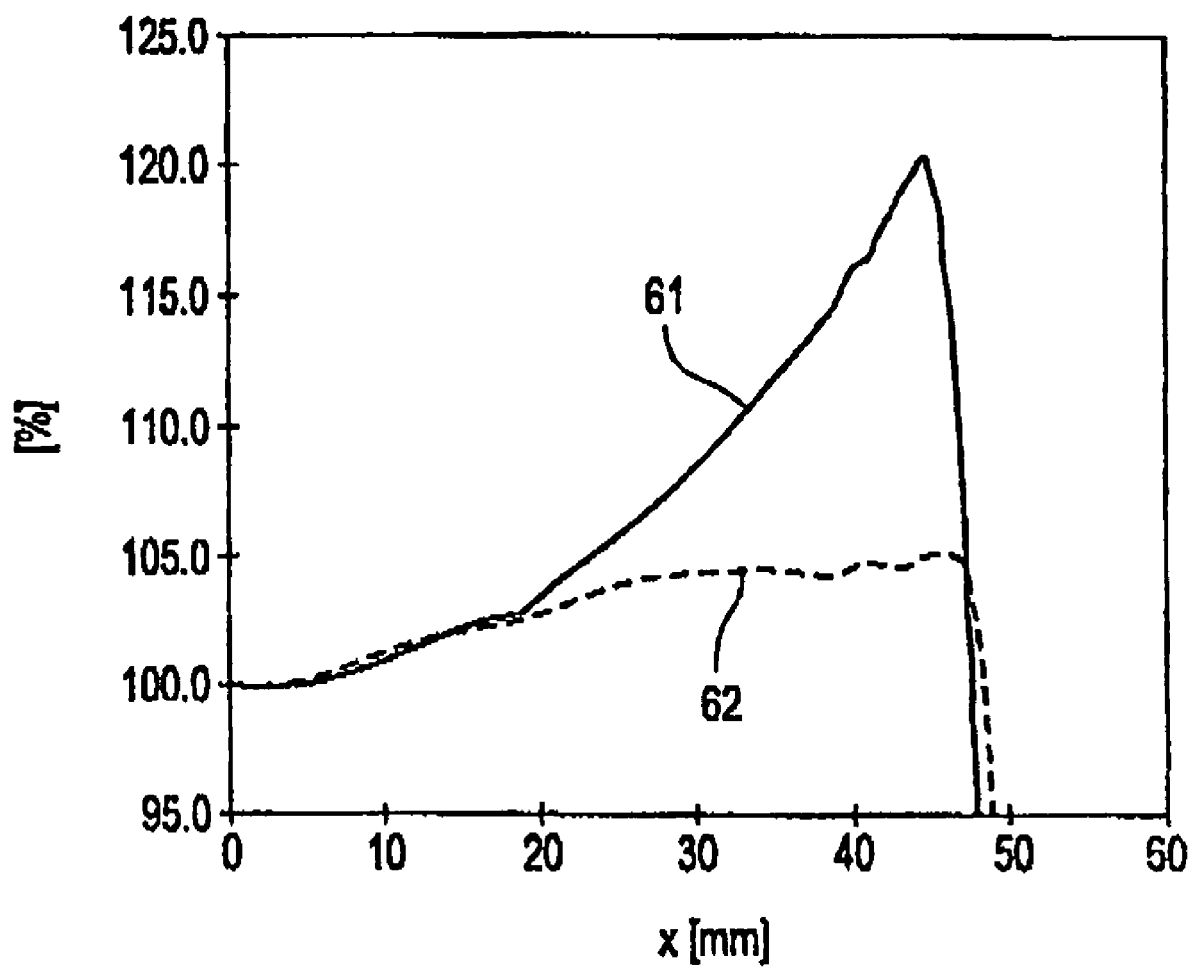
FIG. 6 is a graph of a simulated curve of an integral scanning energy in a plane of a reticle, simulated with all field facets in accordance with the present invention.

However, this relationship is also maintained for the entire system, as shown by the result for all of the field facets in FIG. 6. The curves of FIG. 6 are the result of a simulation with a Laser-produced-Plasma source 200 and the whole illumination system according to FIG. 2. The solid line 61 represents the scanning energy for toroidal field mirrors of the 1st embodiment without conic constants.

A comparison of the solid lines or the dashed lines of FIG. 5 and FIG. 6 shows similar characteristics, that is they are almost identical. The curves in FIG. 5 were calculated (1) by considering only a homogeneously radiating rectangular field, i.e., the central field facet, and (2) the Taylor series was discontinued after the first series. However, the curves in FIG. 6 are a result of a simulation with the real illumination system. It is apparent from a comparison of the curves of FIG. 5 and FIG. 6 that the theoretical model can be used to predict scanning energy distribution, including that of a multifaceted system, and that the following approximations are possible:

Reduction of the problem to the imaging of a rectangular field, in this case the central field facet.

Δr<R: Discontinuation of the Taylor series after the first order.

Systems comprising toroidal field mirrors in which the conic constants can be varied and in which the field mirrors are post-optimized, with their tilt angle and their position being retained, will be presented below.

2nd Example of Embodiment:
Uniformity=2.7%
$\Delta i_{max}$=1.77 mrad
Field mirror 1: $R_x$=−275.24, $R_y$=−7347.29, $K_x$=−3.813, $K_y$=−385.81
Field mirror 2: $R_x$=1067.99, $R_y$=14032.72, $K_x$=−667.20, $K_y$=−25452.70

The dashed curve 52 in FIG. 5 shows the curve of scanning energy expected from the design for the central field facet; the curve scanning energy obtained with the entire system of all of the field facets is shown as dashed curve 62 in FIG. 6. The improvement of the scanning uniformity is obvious using the conical constants in the design of the field mirrors.

Figure 7:
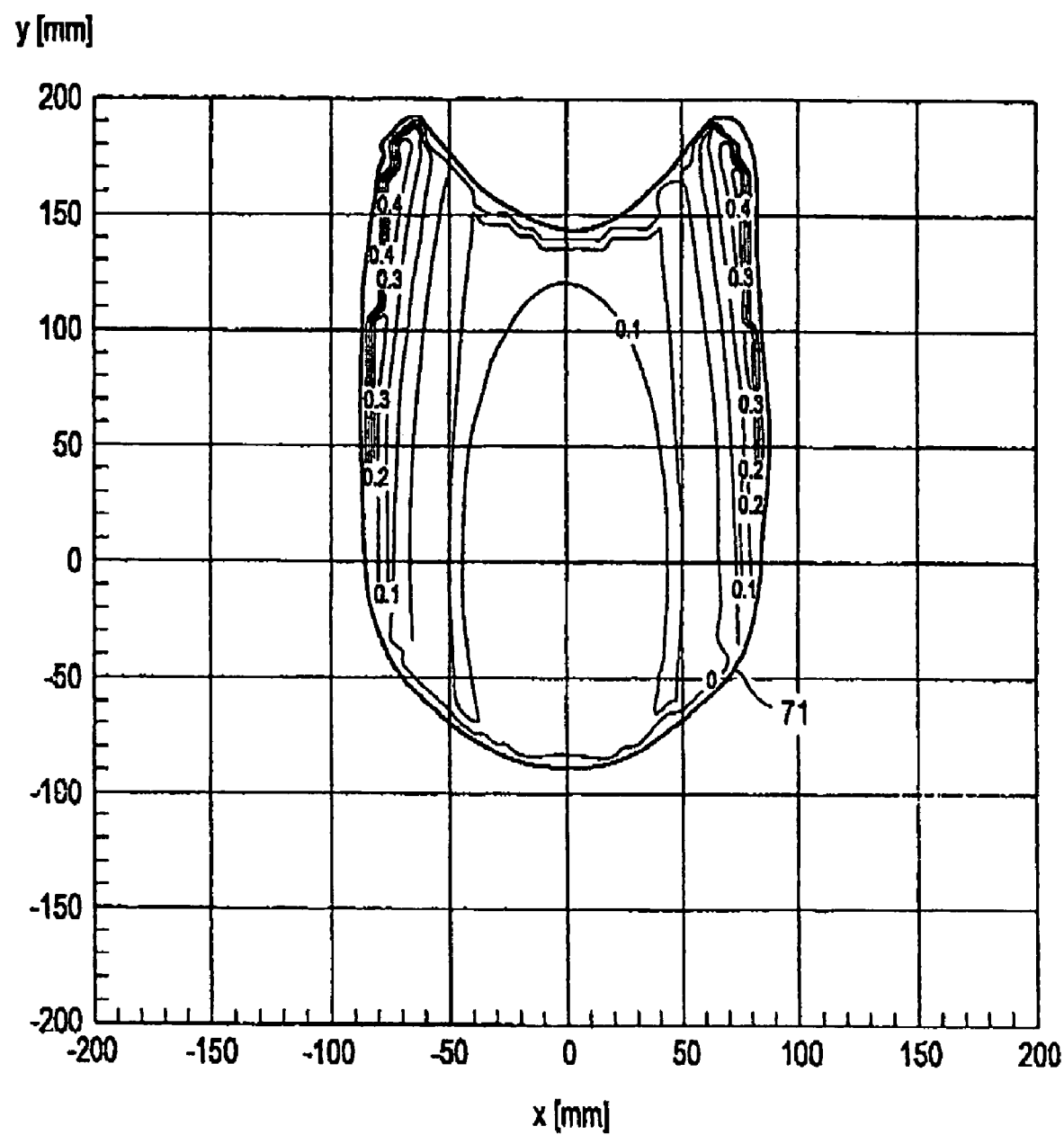
FIG. 7 is a graph of a sagitta difference on a first field mirror with and without distortion correction with variation of $R_x$, $R_y$, $K_x$, $K_y$, in accordance with the present invention.
Figure 8:
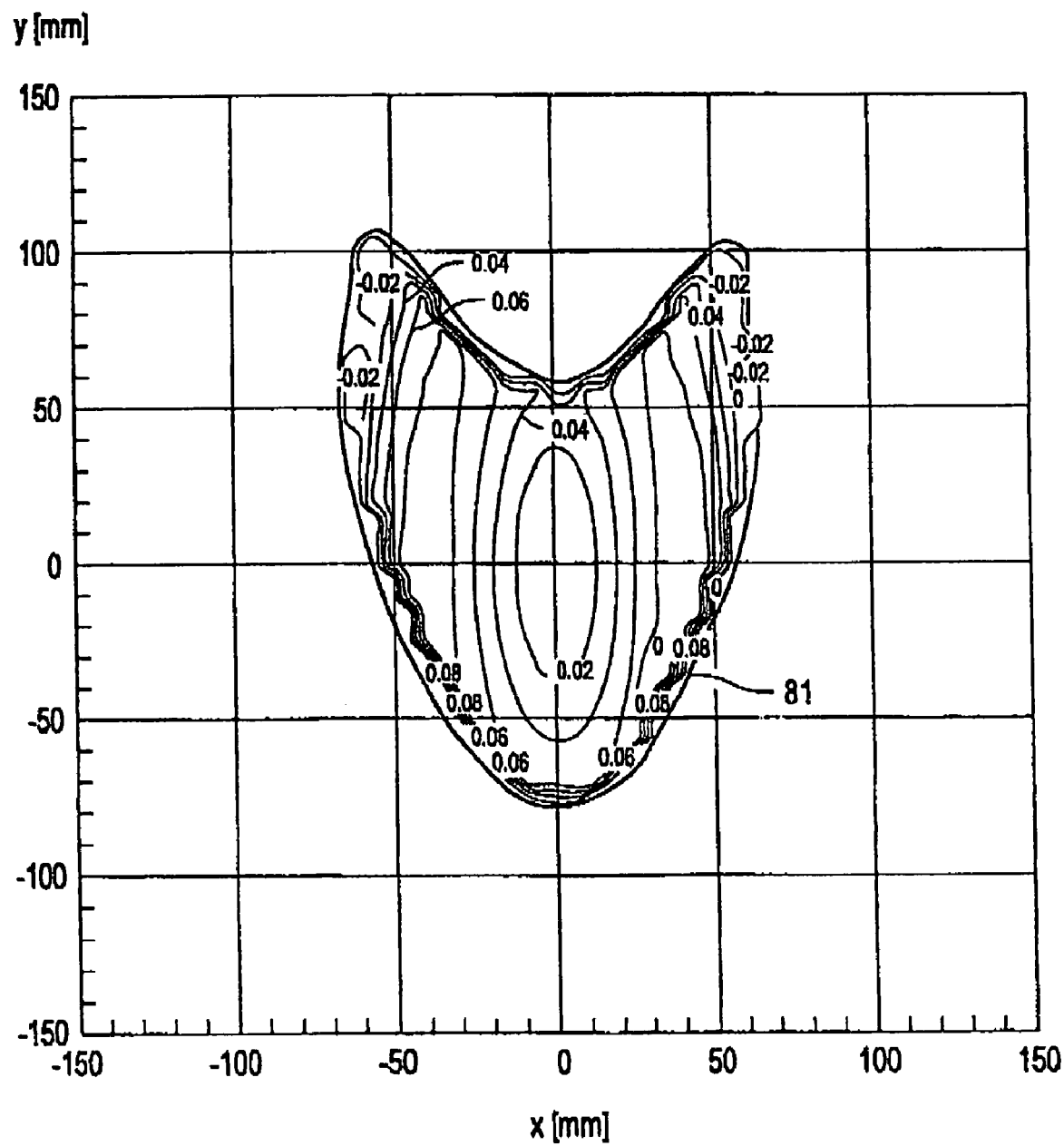
FIG. 8 is a graph of a sagitta difference on a second field mirror with and without distortion correction with variation of $R_x$, $R_y$, $K_x$, $K_y$, in accordance with the present invention.

The necessary surface corrections on the two field mirrors 24 and 25 of FIG. 2 are shown in the illustrations of FIG. 7 and FIG. 8 as contour plots.

The mirrors are bounded according to the illuminated regions on the mirrors. The bounding lines are shown as reference 71 in FIG. 7 and reference 81 in FIG. 8. The contour plots show the sagitta differences of the surfaces of the first and second embodiment in millimeters.

For the first field mirror 24 the maximum sagitta difference is on the order of magnitude of 0.4 mm in FIG. 7. There is also a sign reversal of the sagitta differences.

For the second field mirror 25 the maximum sagitta difference is on the order of magnitude of 0.1 mm in FIG. 8.

The second embodiment was optimized to get the best improvement of the scanning uniformity accepting an arising telecentricity error. The telecentricity violation of 1.77 mrad in the reticle plane of the second embodiment is problematic for a lithographic system.

The following examples demonstrate embodiments in which the maximum telecentricity violation in the plane of the reticle is less or equal 1.0 mrad.

The design shown in the example of embodiment 1 is the starting point for the design of the field mirrors in the following examples. In each example, different sets of surface parameters have been optimized.

3rd Example of Embodiment:

| Optimized parameters | $R_x^{1stmirror}$, $R_y^{1stmirror}$, $K_x^{1stmirror}$, $K_y^{1stmirror}$, $R_x^{2ndmirror}$, $R_y^{2ndmirror}$, $K_x^{2ndmirror}$, $K_y^{2ndmirror}$. |
|---|---|

Uniformity=4.6%
$\Delta I_{max}$=1.00 mrad
Field mirror 1: $R_x$=−282.72, $R_y$=−7691.08, $K_x$=−2.754, $K_y$=−474.838
Field mirror 2: $R_x$=1253.83, $R_y$=16826.99, $K_x$=−572.635, $K_y$=−32783.857

4th Example of Embodiment:

| Optimized parameters | $R_x^{1stmirror}$, $K_x^{1stmirror}$, $K_y^{1stmirror}$, $R_x^{2ndmirror}$, $K_x^{2ndmirror}$, $K_y^{2ndmirror}$. |
|---|---|

Uniformity=5.1%
$\Delta i_{max}$=1.00 mrad
Field mirror 1: $R_x$=−285.23, $R_y$=−8391.89, $K_x$=−2.426, $K_y$=−385.801
Field mirror 2: $R_x$=1324.42, $R_y$=24635.09, $K_x$=−568.266, $K_y$=−31621.360

5th Example of Embodiment:

| Optimized parameters | $R_x^{1stmirror}$, $K_x^{1stmirror}$, $R_x^{2ndmirror}$, $K_x^{2ndmirror}$. |
|---|---|

Uniformity=5.1%
$\Delta i_{max}$=1.00 mrad
Field mirror 1: $R_x$=−280.08, $R_y$=−8391.89, $K_x$=−2.350, $K_y$=0.0
Field mirror 2: $R_x$=1181.53, $R_y$=24635.09, $K_x$=475.26, $K_y$=0.0

6th Example of Embodiment:

| Optimized parameters | $K_x^{1stmirror}$, $K_y^{1stmirror}$, $K_x^{2ndmirror}$, $K_y^{2ndmirror}$. |
|---|---|

Uniformity=6.0%
$\Delta i_{max}$=1.00 mrad
Field mirror 1: $R_x$=−290.18, $R_y$=−8391.89, $K_x$=−2.069, $K_y$=−290.182
Field mirror 2: $R_x$=1494.60, $R_y$=24635.09, $K_x$=−503.171, $K_y$=−1494.602

7th Example of Embodiment:

| Optimized parameters | $K_x^{1stmirror}$, $K_x^{2ndmirror}$. |
|---|---|

Uniformity=7.0%
$\Delta i_{max}$=1.00 mrad
Field mirror 1: $R_x$=−290.18, $R_y$=−8391.89, $K_x$=−1.137, $K_y$=0.0
Field mirror 2: $R_x$=1494.60, $R_y$=24635.09, $K_x$=−305.384, $K_y$=0.0

8th Example of Embodiment:

| Optimized parameters | $R_x^{1stmirror}$, $R_y^{1stmirror}$, $K_x^{1stmirror}$, $K_y^{1stmirror}$. |
|---|---|

Uniformity=7.8%
$\Delta i_{max}$=1.00 mrad
Field mirror 1: $R_x$=−288.65, $R_y$=−8466.58, $K_x$=−0.566, $K_y$=139.337
Field mirror 2: $R_x$=1494.60, $R_y$=24635.09, $K_x$=0.0, $K_y$=0.0

9th Example of Embodiment:

| Optimized parameters | $R_x^{1stmirror}$, $K_x^{1stmirror}$, $K_y^{1stmirror}$. |
|---|---|

Uniformity=7.8%
$\Delta i_{max}$=1.00 mrad
Field mirror 1: $R_x$=−288.59, $R_y$=−8391.89, $K_x$=−0.580, $K_y$=111.346
Field mirror 2: $R_x$=1494.60, $R_y$=24635.09, $K_x$=0.0, $K_y$=0.0

10th Example of Embodiment:

| Optimized parameters | $R_x^{1stmirror}$, $K_x^{1stmirror}$. |
|---|---|

Uniformity=8.1%
$\Delta i_{max}$=1.00 mrad
Field mirror 1: $R_x$=−288.45, $R_y$=−8391.89, $K_x$=−0.574, $K_y$=0.0
Field mirror 2: $R_x$=1494.60, $R_y$=24635.09, $K_x$=0.0, $K_y$=0.0

11th Example of Embodiment:

| Optimized parameters | $K_x^{1stmirror}$, $K_y^{1stmirror}$. |
|---|---|

Uniformity=8.5%
$\Delta i_{max}$=1.00 mrad
Field mirror 1: $R_x$=−290.18, $R_y$=−8391.89, $K_x$=−0.304, $K_y$=−290.182
Field mirror 2: $R_x$=1494.60, $R_y$=24635.09, $K_x$=0.0, $K_y$=0.0

12th Example of Embodiment:

| Optimized parameter | $K_x^{1stmirror}$. |
|---|---|

Uniformity=8.6%
$\Delta i_{max}$=1.00 mrad
Field mirror 1: $R_x$=−290.18, $R_y$=−8391.89, $K_x$=−0.367, $K_y$=0.0
Field mirror 2: $R_x$=1494.60, $R_y$=24635.09, $K_x$=0.0, $K_y$=0.0

The results for the various examples of embodiment are summarized in Table 6, with the optimized parameters designated with an "x".

Figure 9:
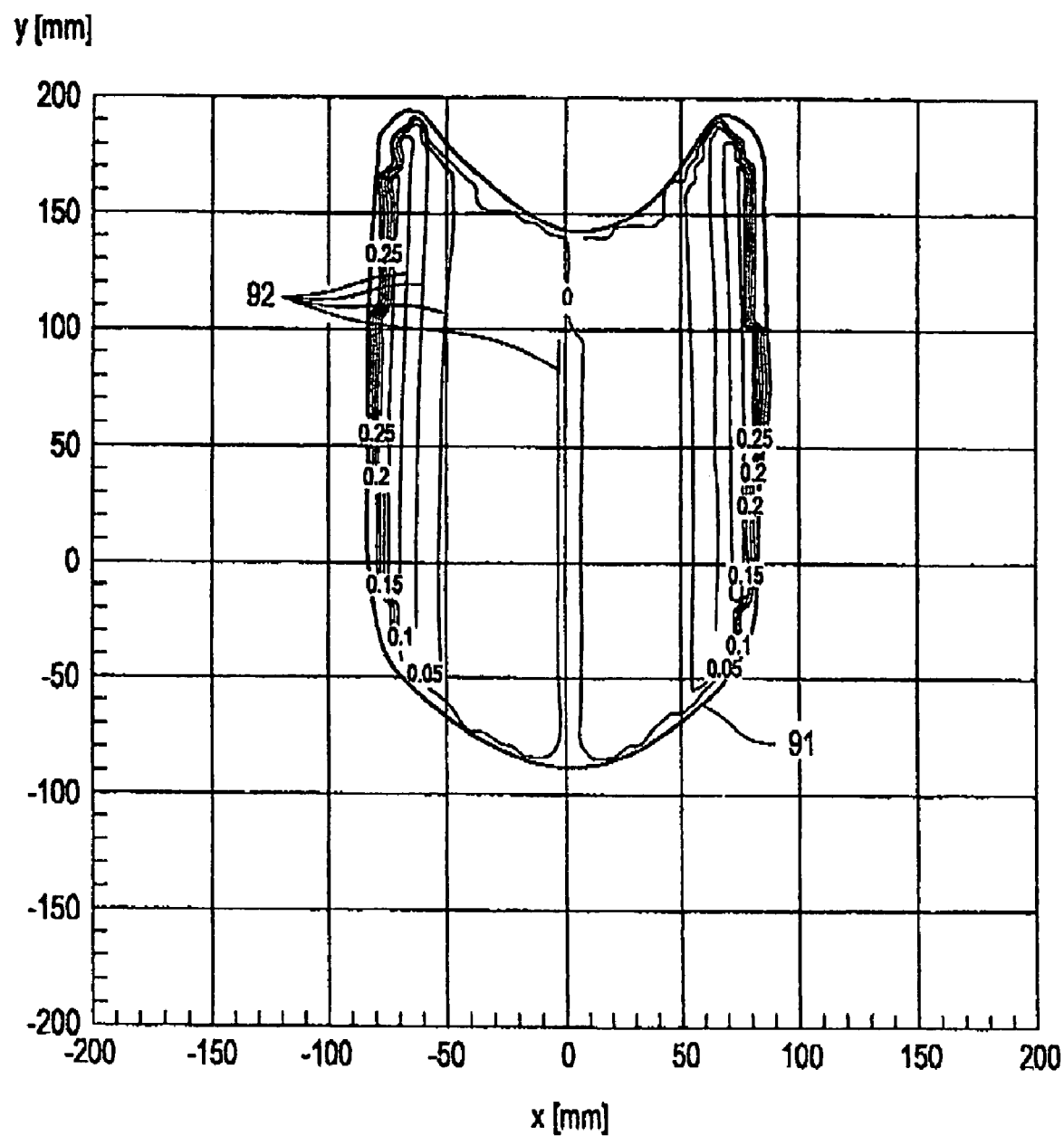
FIG. 9 is a graph of a sagitta difference on a first field mirror with and without distortion correction with variation of only a conic constants $K_x$, in accordance with the present invention.
Figure 10:
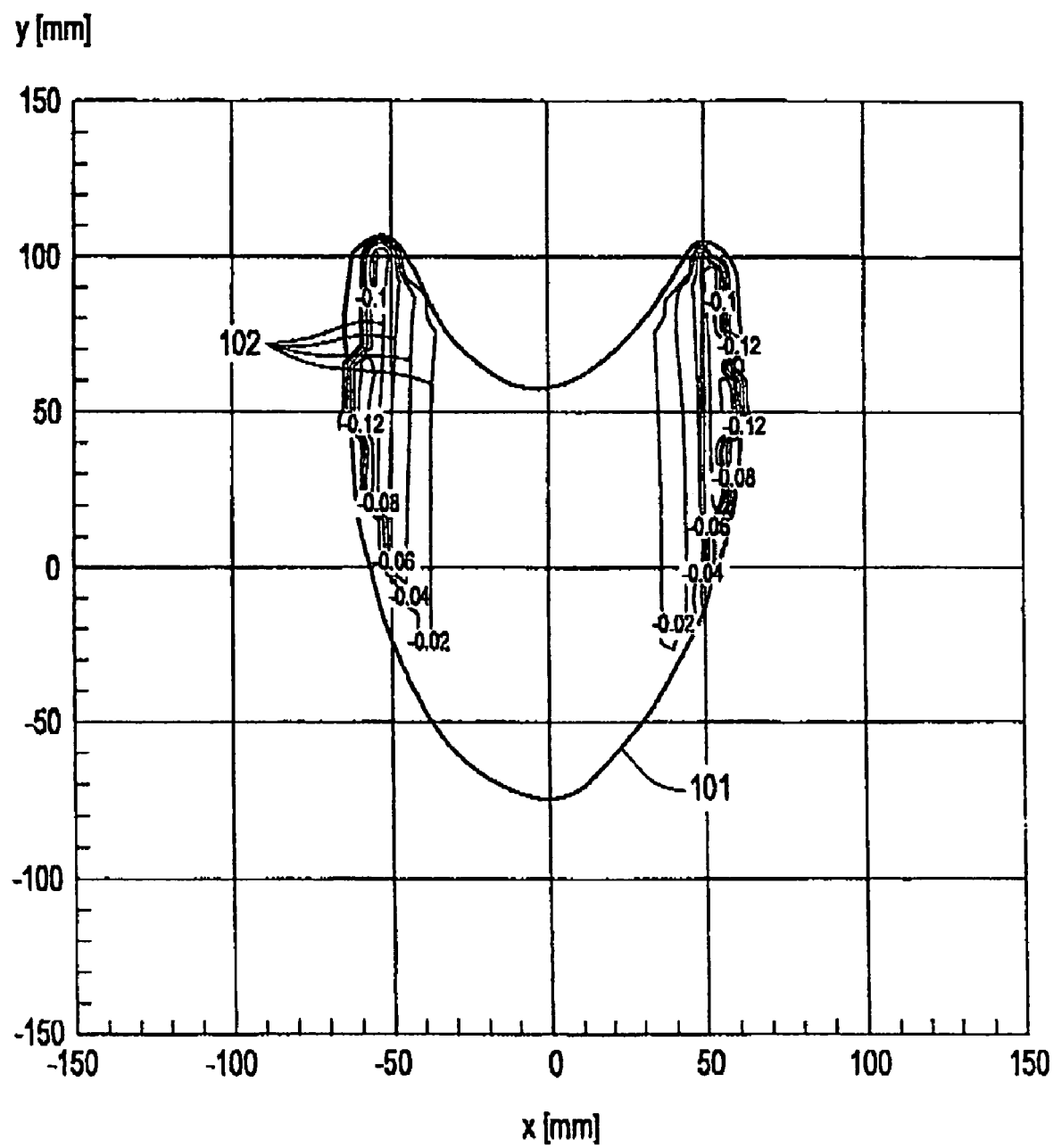
FIG. 10 is a graph of a sagitta difference on a second field mirror with and without distortion correction with variation of only a conic constants $K_x$, in accordance with the present invention

While only static correction of uniformity was examined with the exemplary embodiments described so far, in which essentially only the surface was "warped", an active variant of the invention will be described below. Actuation in this case can occur by means of mechanical actuators. A possible actuator can be a piezo-element at the rear side of a field mirror to vary the shape of the mirror by changing the voltage to the piezo-element. As stated above, great improvements of uniformity can be produced even when only the x surface parameters are changed. If only the conic constants in the x direction are varied, the sagitta differences have the same algebraic sign over the entire surface, which is advantageous for the surface manipulation. FIG. 9 and FIG. 10 show the sagitta differences between the field mirrors of embodiment #6 and embodiment #1. The conic constants in the x direction were varied here for field mirror 1 and 2. The maximum sagitta differences are 250 μm for the first field mirror 24 and 100 μm for the second field mirror 25. Uniformity is improved from 10.7% to 7.0% with an additional telecentricity violation of 1.0 mrad in the plane of the reticle. This telecentricity violation corresponds to 4.0 mrad in the plane of the wafer, if the projection objective has a magnification of β=−0.25. Accordingly the uniformity of scanning energy can be corrected by ±3.7% by active manipulation on the mirrors of the field lens group.

When only the conic constants in the x direction are varied, the sagitta changes depend almost only on x. The lines with the same sagitta difference are nearly parallel to the y-axis, which is, in this example, the scanning direction.

The sagitta distribution $pfh_{ref}$ of the reference surfaces (1$^{st}$ embodiment) of the field mirrors can be described by:

$$pfh_{ref}(x, y) = \frac{\frac{1}{R_x} \cdot x^2 + \frac{1}{R_y} \cdot y^2}{1 + \sqrt{1 - \left(\frac{1}{R_x}\right)^2 \cdot x^2 - \left(\frac{1}{R_y}\right)^2 \cdot y^2}}$$

TABLE 6

| $R_x^{1stmirror}$ | $R_y^{1stmirror}$ | $K_x^{1stmirror}$ | $K_y^{1stmirror}$ | $R_x^{2ndmirror}$ | $R_y^{2ndmirror}$ | $K_x^{2ndmirror}$ | $K_y^{2ndmirror}$ | Uniformity [%] | Telecentricity error in the reticle plane $\Delta i_{max}$ [mrad] |
|---|---|---|---|---|---|---|---|---|---|
| | | | | Without conic constants | | | | 10.7 | 0.24 |
| | | | | Variation, field mirror 1 | | | | | |
| | X | | | | | | | 8.6 | 1.0 |
| | X | X | | | | | | 8.5 | 1.0 |
| X | X | | | | | | | 8.1 | 1.0 |
| X | X | X | | | | | | 7.8 | 1.0 |
| X | X | X | X | | | | | 7.8 | 1.0 |
| | | | | Variation, field mirrors 1 + 2 | | | | | |
| | X | | | | X | | | 7.0 | 1.0 |
| | X | X | | | X | X | | 6.0 | 1.0 |
| X | X | | | X | X | | | 5.1 | 1.0 |
| X | X | X | X | | X | X | | 5.1 | 1.0 |
| X | X | X | X | X | X | X | X | 4.6 | 1.0 |

Table 6 shows that field mirror 1 and field mirror 2 improve the scanning uniformity to almost the same extent, with the principal fraction of this being carried by the x parameters, which ultimately determine the azimuthal magnification scale $\beta_s$.

x and y are the mirror coordinates in the local coordinate system of the mirror surface. $R_x$ and $R_y$ are the radii of the toroidal mirror.

The sagitta distribution $pfh_{act}$ of the manipulated surfaces of the field mirrors can be described by:

$$pfh_{ref}(x, y) = \frac{\frac{1}{R_x} \cdot x^2 + \frac{1}{R_y} \cdot y^2}{1 + \sqrt{1 - (1+K_x) \cdot \left(\frac{1}{R_x}\right)^2 \cdot x^2 - (1+K_y) \cdot \left(\frac{1}{R_y}\right)^2 \cdot y^2}}$$

$K_x$ and $K_y$ are the conical constants.

For the sagitta difference $\Delta pfh$, this gives:

$$\Delta pfh(x, y) = pfh_{act}(x, y) - pfh_{ref}(x, y)$$

In embodiment #1:
Field mirror 1: $R_x=-290.18$, $R_y=8391.89$, $K_x=0.0$, $K_y=0.0$
Field mirror 2: $R_x=-1494.60$, $R_y=-24635.09$, $K_x=0.0$, $K_y=0.0$ In embodiment #6:
Field mirror 1: $R_x=-290.18$, $R_y=-8391.89$, $K_x=-1.137$, $K_y=0.0$
Field mirror 2: $R_x=1494.60$, $R_y=24635.09$, $K_x=-305.384$, $K_y=0.0$ Preferably, the actuators or mechanical regulators are placed on the mirrors on equipotential lines 92, 502 (sites of equal sagitta difference). In the example of embodiment #6, these rows of identical actuators run almost parallel to the y axis, and therefore, it is unnecessary to control a two-dimensional field of actuators, but it suffices to control only a row of different actuator banks.

For example, on the second field mirror an arrangement of actuator rows can be proposed as shown in FIG. 11. The second field mirror is shown in the plan view (x-y-view) at the top and side view (x-z-view) at the bottom of FIG. 11. In the plan view the actuator beams 5', 4', 3', 2', 1', 0, 1, 2, 3, 4, 5 are arranged along equipotential lines. Because of the symmetry regarding the y-axis the corresponding actuator beams 5 and 5', or 4 and 4', or 3 and 3', or 2 and 2', or 1 and 1' can be activated with the same signal. The actuators in the plan view are represented by lines, and in the side view by arrows.

An industrial implementation would be to design the entire row of actuators as actuator beams 5', 4', 3', 2', 1', 0, 1, 2, 3, 4, 5. When the beam is actuated, the entire row of actuators is raised or lowered.

The distances between the actuator beams can be chosen dependent on the gradient of the sagitta differences. For high values of the gradient a dense arrangement of the actuator beams is necessary, for low values of the gradient the distances can be increased. In the example of FIG. 10 the gradient of the sagitta differences is high at the edges of the illuminated field, so more actuator beams are at the edge of the field than in the center as shown in FIG. 11.

An active correction of uniformity can be accomplished as follows using the actuators described above.

The curve of scanning energy $SE_{standard}(x_r)$ in the plane of the reticle is established based on the geometric design of the field lens group.

Now the scanning energy $SE_{wafer}(x_{wafer})$ in the plane of the wafer is measured, including all coating, absorption, and vignetting effects.

For the lithographic process, $SE_{wafer}(x_{wafer})$ has to be independent of the x-position $x_w$ in the plane of the wafer. If this is not the case, the $x_w$-dependent offset has to be addressed by the illumination system.

Since the imaging of the reticle plane to the wafer plane is almost ideal imaging, $SE_{wafer}(x_{wafer})$ can be converted directly into the plane of the reticle $SE_{wafer}(x_r)$ using the given magnification of the projection objective.

If the design reference $SE_{standard}(x_r)$ and the measured distribution $SE_{wafer}(x_r)$ are normalized at 100% for $x_r=0.0$, then the necessary correction of the surfaces of the field mirrors can be calculated from the difference $$SE_{Des}^{akt}(x_r):$$

$$SE_{Des}^{akt}(x_r) = SE_{wafer}(x_r) - SE_{standard}(x_r)$$

$$SE_{Des}^{akt}(x_r)$$

determines the azimuthal magnification $\beta_s$, and from this the necessary corrections for the field lens group.

If there is a difference $$SE_{Des}^{akt}(x_r)$$

between the target $SE_{standard}(x_r)$ and actual values $SE_{wafer}(x_r)$ due to time-dependent or illumination setting-dependent effects for example, the uniformity of the scanning energy can be corrected by the actuators described above within certain limits. Up to ±2.5% uniformity can be corrected with one manipulable field mirror, and up to ±5.0% with two manipulable field mirrors.

In case of static deviations, e.g., deviations from coating effects, absorption effects, etc., which are known in the design phase, these effects can be taken into consideration in a modified field lens group design, and correction with actuators is then unnecessary.

Intensity loss-free control of scanning energy is achieved by the present invention, where the field-dependent scan path, the coating, absorption, and vignetting effects, if known, can betaken into account in the static design of the field lens group. Furthermore, the invention proposes dynamic control with active field mirrors for time-dependent or illumination setting-dependent effects. If a telecentricity error of ±4.0 mrad is allowed in the plane of the wafer, the uniformity correction can be up to ±5%.

Figure 12:
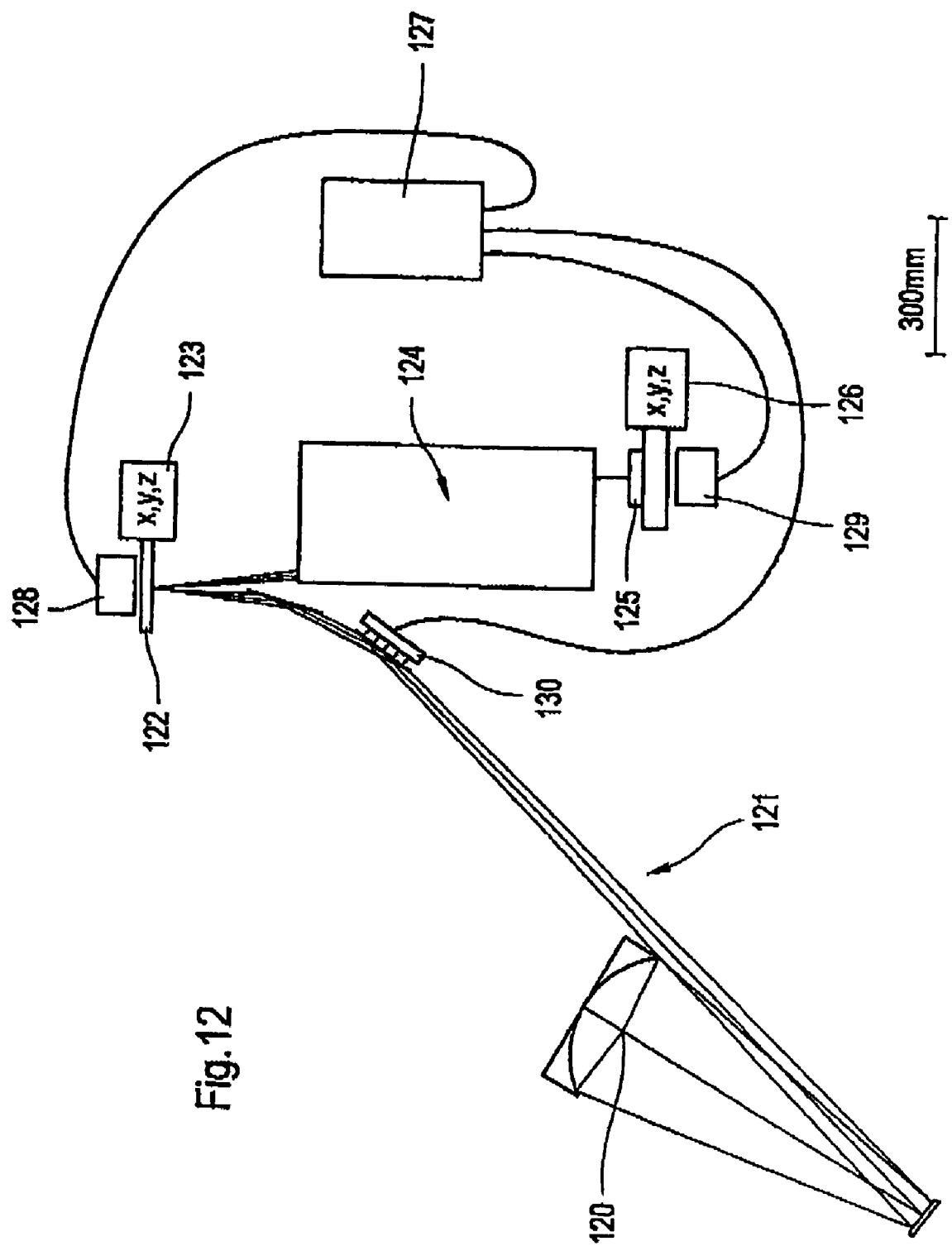
FIG. 12 is a side view of an EUV projection exposure system in accordance with the present invention.

In FIG. 12 a projection exposure system comprising an Laser-Produced-Plasma source as light source 120, an illumination system 121 corresponding to the invention, a mask 122, also known as a reticle, a positioning system 123, a projection objective 124 and a wafer 125 to be exposed on a positioning table 126 is shown. The projection objective 124 for EUV lithography is typically a mirror system with an even number of mirrors to have reticle and wafer on different sides of the projection objective 124.

Detection units in a reticle plane 128 and in a wafer plane 129 are provided to measure the intensity distribution inside the illuminated field. The measured data are transferred to a computation unit 127. With the measured data the scanning energy and scanning uniformity can be evaluated. If there is a difference between the predetermined and the measured intensity distribution, the surface corrections are computed.

The actuator drives 130 at one of the field mirrors are triggered to manipulate the mirror surface.

It should be understood that various alternatives and modifications could be devised by those skilled in the art. The present invention is intended to embrace all such alternatives, modifications and variances that fall within the scope of the appended claims.

What is claimed is:

1. An illumination system for scanning lithography, comprising:
   a component that alters a direction of propagation of a light beam,
   wherein said component is selected from the group consisting of a field mirror and a field lens, and
   wherein said component (a) has an aspheric surface upon which said light beam is incident, and (b) is corrected in an aplanatic manner such that a σ-variation in an exit pupil of the illumination system is less than 10%.

2. The illumination system of claim 1, wherein said component is non-toric.

3. The illumination system of claim 1, further comprising:
   an object plane with an illuminated field,
   wherein said component has a shape that influences an intensity distribution of said illuminated field.

4. The illumination system of claim 1, further comprising:
   an object plane with an illuminated field,
   wherein said illuminated field has a scanning direction, and
   wherein said component has a shape such that said illuminated field is distorted in said object plane perpendicular to said scanning direction.

5. The illumination system of claim 1, further comprising:
   an object plane with an illuminated field,
   wherein said illuminated field has a scanning direction, and
   wherein said illuminated field has an illumination intensity that varies along a direction that is perpendicular to said scanning direction.

6. The illumination system of claim 1, further comprising:
   a light source for emitting said light beam; and
   an object plane downstream of said light source,
   wherein said component is situated in a light path from the light source to said object plane, before said object plane,
   wherein said light source illuminates a field in said object plane via said component, and
   wherein said object plane has a uniformity of scanning energy in a range of about ±7%.

7. The illumination system of claim 1, further comprising:
   a light source for emitting said light beam; and
   an object plane downstream of said light source;
   wherein said component is situated in a light path from said light source to said object plane,
   wherein said light source illuminates a field in said object plane via said component, and
   wherein said component has a shape that influences a shape of said field.

8. The illumination system of claim 1, further comprising an aperture stop plane, wherein said component has a shape such that said aperture stop plane is imaged in an exit pupil of the illumination system.

9. The illumination system of claim 1, further comprising an object plane with an illuminated field having a shape selected from the group consisting of a rectangle and a segment of a ring.

10. The illumination system of claim 1, wherein said component comprises a grazing incident mirror.

11. The illumination system of claim 1, further comprising:
    a light source for emitting said light beam; and
    an optical element for transforming said light source into secondary light sources,
    wherein said optical element is situated downstream of said light source and in a light path from said light source to said component.

12. The illumination system of claim 1, wherein said component includes an actuator for active control of said surface.

13. The illumination system of claim 1, wherein said light beam has a wavelength $\leq 193$ nm.

14. The illumination system of claim 5, wherein said illumination intensity decreases from a center of said illuminated field to an edge of said illuminated field.

15. The illumination system of claim 5, wherein said illumination intensity increases from a center of said illuminated field to an edge of said illuminated field.

16. The illumination system of claim 11, wherein said optical element comprises a first mirror that is divided into several single mirror elements.

17. The illumination system of claim 16, wherein said mirror elements of said first mirror are field facets that are imaged into an object plane of the illumination system.

18. The illumination system of claim 16, further comprising a second mirror that is divided into several single mirror elements that are located substantially at a position of said secondary light sources.

19. The illumination system of claim 18,
    wherein said mirror elements of said first mirror are field facets that are imaged into an object plane of the illumination system, and
    wherein said mirror elements of said second mirror are pupil facets that are imaged into an exit pupil of the illumination system.

20. The illumination system of claim 17,
    wherein said imaging of said field facets into said object plane includes a radial imaging and an azimuthal imaging, and
    wherein said azimuthal imaging is distorted.

21. The illumination system of claim 20, wherein said component has a shape that influences an azimuthal distortion of an image formation of said field facets.

22. The illumination system of claim 11, wherein said component has a shape such that that said secondary light sources are imaged in an exit pupil of the illumination system.

23. The illumination system of claim 22, wherein said component has a shape such that images of said secondary light sources illuminate said exit pupil such that a σ-variation in said exit pupil is less than 10%.

24. The illumination system of claim 12, further comprising:
    a light source that illuminates a field in an object plane via said component,
    wherein said active control of said surface modifies an intensity distribution in said field.

25. The illumination system of claim 12,
    wherein the illumination system has a scanning direction, and
    wherein said active control of said surface influences a shape of said surface perpendicular to said scanning direction.

26. The illumination system of claim 12, wherein said active control of said surface influences σ-variations in an exit pupil of the illumination system.

27. The illumination system of claim 12,
wherein the illumination system has a scanning direction, and
wherein said actuator is one of a plurality of such actuators that are arranged in rows parallel to said scanning direction.

28. The illumination system of claim 13, wherein said light beam illuminates a slit downstream of said component.

29. An illumination system for scanning lithography for wavelengths $\leqq 193$ nm, for illuminating a slit, comprising:
at least one field mirror or at least one field lens,
wherein at least one of said field mirror(s) or said field lens(es) has (have) an inclined aspheric shape, and is corrected in an aplanatic manner such that a $\sigma$-variation in an exit pupil of the illumination system is less than 10%.

30. A projection exposure system for scanning-microlithography, comprising:
an illumination system having a component that alters a direction of propagation of a light beam, wherein said component is selected from the group consisting of a field mirror and a field lens, and has an aspheric surface upon which said light beam is incident, and wherein said illumination system has an exit pupil with $\sigma$-variations of less than 10%;
a support system for holding a mask to be illuminated by the illumination system;
a projection objective for imaging said mask to an image plane of said projection objective; and
a support system for holding a light-sensitive subject in said image plane.

31. The projection exposure system of claim 30, wherein the projection exposure system has a maximum deviation of about ±10.0 mrad between directions of centroid rays and chief rays of said projection objective in said image plane.

32. The projection exposure system of claim 30, wherein said image plane has a uniformity of scanning energy in a range of about ±7%.

33. A method, comprising employing the projection exposure system of claim 30 to produce a microstructured device.

* * * * *